US012745489B2

(12) United States Patent
Wang et al.

(10) Patent No.: US 12,745,489 B2
(45) Date of Patent: Sep. 22, 2026

(54) DISPLAY DEVICE HAVING ONE ELECTRODE OVERLAPPING ANOTHER ELECTRODE THROUGH UNIQUE STRUCTURE OR OPENINGS OF INSULATING LAYER ABOVE AND CONTACTING THE LIGHT EMITTING ELEMENT FROM DIFFERENT ENDS

(71) Applicant: Samsung Display Co., LTD., Yongin-si (KR)

(72) Inventors: Jeong Kook Wang, Hwaseong-si (KR); Ki Nyeng Kang, Sejong-si (KR); In Pyo Kim, Asan-si (KR); Jae Hee Kim, Sejong-si (KR); Eun Je Jang, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 614 days.

(21) Appl. No.: 18/096,166

(22) Filed: Jan. 12, 2023

(65) Prior Publication Data

US 2023/0275189 A1 Aug. 31, 2023

(30) Foreign Application Priority Data

Feb. 25, 2022 (KR) ........................ 10-2022-0025185

(51) Int. Cl.
*H10H 20/831* (2025.01)
*H10H 20/84* (2025.01)
(Continued)

(52) U.S. Cl.
CPC ...... *H10H 20/8312* (2025.01); *H10H 20/857* (2025.01); *H10W 90/00* (2026.01)

(58) Field of Classification Search
CPC .............. H01L 25/0753; H10H 20/831; H10H 20/8312; H10H 20/84; H10H 20/857; H10H 29/142; H10W 90/00
See application file for complete search history.

(56) References Cited

U.S. PATENT DOCUMENTS 11,050,001 B2 * 6/2021 Ko et al. ................ H01L 33/38
11,791,447 B2 10/2023 Lee et al.
(Continued)

FOREIGN PATENT DOCUMENTS

KR 10-2020-0010701 1/2020
KR 10-2021-0053391 5/2021
(Continued)

*Primary Examiner* — Wael M Fahmy
*Assistant Examiner* — Alice W Tang
(74) *Attorney, Agent, or Firm* — Womble Bond Dickinson (US) LLP

(57) ABSTRACT

A display device comprises first and second electrodes disposed on a substrate, extended parallel to each other, and spaced apart from each other, light-emitting elements disposed on the first electrode and the second electrode, a first insulating layer covering at least a portion of each of the light-emitting elements, a first connection electrode disposed on the light-emitting elements and electrically contacting a first end of each of the light-emitting elements, and a second connection electrode disposed on the light-emitting elements and the first insulating layer and electrically contacting a second end of each of the light-emitting elements, wherein the first connection electrode and the second connection electrode overlap each other in a thickness direction.

20 Claims, 21 Drawing Sheets

(51) Int. Cl.
*H10H 20/857* (2025.01)
*H10W 90/00* (2026.01)

(56) References Cited

U.S. PATENT DOCUMENTS

| | | | |
|---|---|---|---|
| 12,302,690 | B2 | 5/2025 | Kim et al. |
| 12,463,185 | B2 | 11/2025 | Kim |

FOREIGN PATENT DOCUMENTS

| | | | | |
|---|---|---|---|---|
| KR | 10-2021-0055829 A | | 5/2021 | |
| KR | 10-2021-0132255 A | | 11/2021 | |
| KR | 10-2021-0148536 A | | 12/2021 | |
| WO | WO 2020/171323 A1 | * | 8/2020 | ......... H10H 20/0364 |

* cited by examiner

DPA
PAS3
PAS2
PAS1
VIA
PV1
IL1
BL
SUB
E2'
E2
CT1
CT2
BNL
CNE1
PAS1
PAS2
ED
CNE2
PAS3
BP1
BP2
RME1
RME2
VL1
VL2
DR3
RME: RME1, RME2
CNE: CNE1, CNE2

DPA
PAS2
BNL
PAS1
VIA
PV1
IL1
BL
SUB
CTS
VL2
RME2
CNE2
BP2
D
PAS2
ED
GI
D2
ACT2
G2
S2
T2
BP1
CNE1
RME1
VL1
D1
ACT1
G1
S1
T1
GI
BML
CTD
CDP1
DR3
RME: RME1, RME2
CNE: CNE1, CNE2

RME: RME1, RME2, RME3, RME4
CNE: CNE1, CNE2, CNE3, CNE4, CNE5
ED: ED1, ED2, ED3, ED4

DISPLAY DEVICE HAVING ONE ELECTRODE OVERLAPPING ANOTHER ELECTRODE THROUGH UNIQUE STRUCTURE OR OPENINGS OF INSULATING LAYER ABOVE AND CONTACTING THE LIGHT EMITTING ELEMENT FROM DIFFERENT ENDS

CROSS-REFERENCE TO RELATED APPLICATION(S)

This application claims priority to and benefits of Korean Patent Application No. 10-2022-0025185 under § 119, filed on Feb. 25, 2022, in the Korean Intellectual Property Office (KIPO), the entire contents of which are incorporated herein by reference.

BACKGROUND

1. Technical Field

The disclosure relates to a display device.

2. Description of the Related Art

Display devices become more and more important as multimedia technology evolves. Accordingly, a variety of types of display devices such as organic light-emitting display (OLED) devices and liquid-crystal display (LCD) devices are currently used.

As a display device for displaying images, there is a self-luminous display device including light-emitting elements. Examples of such a self-luminous display device may include an organic light-emitting display device using an organic material as the light-emitting material for the light-emitting elements, or an inorganic light-emitting display device using an inorganic material as the light-emitting material for the light-emitting elements.

SUMMARY

Aspects of the disclosure provide a display device that can prevent damage to electrodes or light-emitting elements due to static electricity during the processes.

It should be noted that objects of the disclosure are not limited to the above-mentioned object; and other objects of the disclosure will be apparent to those skilled in the art from the following descriptions.

According to an embodiment of the disclosure, a display device comprises first and second electrodes disposed on a substrate, extended parallel to each other and spaced apart from each other, light-emitting elements disposed on the first electrode and the second electrode, a first insulating layer covering at least a portion of each of the light-emitting elements, a first connection electrode disposed on the light-emitting elements and electrically contacting a first end of each of the light-emitting elements, and a second connection electrode disposed on the light-emitting elements and the first insulating layer and electrically contacting a second end of each of the light-emitting elements, wherein the first connection electrode and the second connection electrode overlap each other in a thickness direction.

In an embodiment, a width of the second connection electrode may be greater than a width of the first connection electrode in a longitudinal direction of the light-emitting elements.

In an embodiment, the first connection electrode partially may overlap the light-emitting elements in the thickness direction while the second connection electrode entirely overlaps the light-emitting elements in the thickness direction.

In an embodiment, the first connection electrode may overlap with the first electrode but not with the second electrode, and the second connection electrode may overlap the first electrode and the second electrode.

In an embodiment, an area of the second connection electrode may be larger than an area of the first connection electrode.

In an embodiment, the first insulating layer may comprise a first opening exposing the first end of each of the light-emitting elements and a second opening exposing the second end of each of the light-emitting elements, and an area of the second opening may be larger than an area of the first opening.

In an embodiment, the first connection electrode may electrically contact the light-emitting elements through the first opening, and the second connection electrode may electrically contact the light-emitting elements through the second opening.

In an embodiment, a contact area between the second connection electrode and the light-emitting elements may be larger than a contact area between the first connection electrode and the light-emitting elements.

In an embodiment, the display device may further comprise a second insulating layer disposed between the first connection electrode and the second connection electrode to insulate the first connection electrode from the second connection electrode.

In an embodiment, the first insulating layer and the second insulating layer may comprise a third opening formed between the first opening and the second opening to expose upper surface of the light-emitting elements, and the second connection electrode may electrically contact upper surfaces of the light-emitting elements through the third opening.

In an embodiment, the first connection electrode may be spaced apart from the first opening in a plan view.

According to an embodiment of the disclosure, a display device comprises first and second electrodes disposed on a substrate, extended parallel to each other and spaced apart from each other, light-emitting elements disposed on the first electrode and the second electrode, a first insulating layer comprising openings partially exposing the light-emitting elements, a first connection electrode disposed on the light-emitting elements and electrically contacting a first end of each of the light-emitting elements, and a second connection electrode disposed on the light-emitting elements and the first insulating layer and electrically contacting a second end of each of the light-emitting elements, wherein a contact area between the second connection electrode and the light-emitting elements is larger than a contact area between the first connection electrode and the light-emitting elements.

In an embodiment, the openings of the first insulating layer may comprise a first opening exposing a first end of each of the light-emitting elements and a second opening exposing a second end of each of the light-emitting elements, the first connection electrode may electrically contact the first end of each of the light-emitting elements through the first opening, and the second connection electrode may electrically contact the second end of each of the light-emitting elements through the second opening.

In an embodiment, the openings of the first insulating layer may comprise a third opening formed between the first opening and the second opening to expose a portion of an upper surface of each of the light-emitting elements, and the second connection electrode may electrically contact the portion of the upper surface of each of the light-emitting elements through the third opening.

In an embodiment, an area of the second opening may be larger than an area of the first opening and larger than an area of the third opening, and an area of the third opening may be smaller than an area of the first opening.

In an embodiment, an area of the second connection electrode may be larger than an area of the first connection electrode.

In an embodiment, the first connection electrode and the second connection electrode may overlap each other in a thickness direction.

According to an embodiment of the disclosure, a display device comprises first and second electrodes disposed on a substrate, extended parallel to each other and spaced apart from each other, light-emitting elements disposed on the first electrode and the second electrode, a first insulating layer covering at least a portion of each of the light-emitting elements and comprising an organic material, a first connection electrode disposed on the light-emitting elements and the first insulating layer and electrically contacting a first end of each of the light-emitting elements, and a second connection electrode disposed on the light-emitting elements and the first insulating layer and electrically contacting a second end of each of the light-emitting elements, wherein the first insulating layer comprises a protrusion that protrudes from at least a portion of its upper surface.

In an embodiment, the first connection electrode may be extended from one side of the first insulating layer to one side of the protrusion, and the second connection electrode may be extended from an opposite side of the first insulating layer to an opposite side of the protrusion.

In an embodiment, the first connection electrode and the second connection electrode may be spaced apart from each other with the protrusion disposed between the first and second connection electrodes.

Aspects of the disclosure provide a display device with an overcurrent protection structure that allows static electricity to escape which may be generated during the processes. Accordingly, it is possible to prevent damage to a second connection electrode or the light-emitting elements due to static electricity, thereby addressing dark spot defects.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
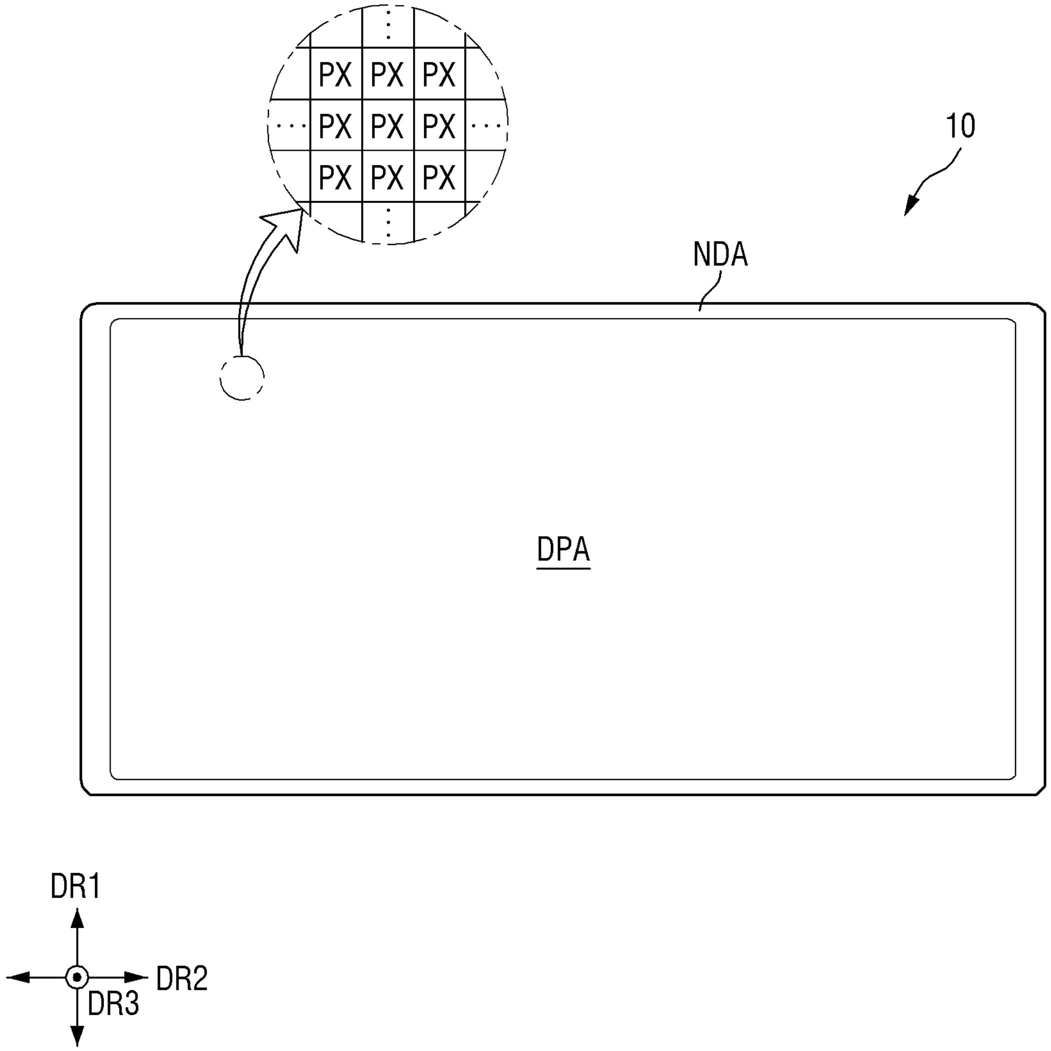
FIG. 1 is a schematic plan view of a display device according to an embodiment of the disclosure.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification. When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

Spatially relative terms, such as "beneath," "below," "under," "lower," "on," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described with reference to the accompanying drawings.

FIG. 1 is a schematic plan view of a display device according to an embodiment of the disclosure.

Referring to FIG. 1, the display device 10 displays a moving image or a still image. A display device 10 may refer to any electronic device that provides a display screen. For example, the display device 10 may include a television set, a laptop computer, a monitor, an electronic billboard, the Internet of things (IoT) devices, a mobile phone, a smartphone, a tablet personal computer (PC), an electronic watch, a smartwatch, a watch phone, a head-mounted display device, a mobile communications terminal, an electronic notebook, an electronic-book reader, a portable multimedia player (PMP), a navigation device, a game console, a digital camera, a camcorder, etc.

The display device 10 includes a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display panel 10, but the disclosure is not limited thereto. Any other display panel may be employed as long as the technical idea of the disclosure can be equally applied.

The shape of the display device 10 may be modified in a variety of ways. For example, the display device 10 may have shapes such as a rectangle with longer lateral sides, a rectangle with longer vertical sides, a square, a quadrangle with rounded corners (vertices), other polygons, a circle, etc. The shape of a display area DPA of the display device 10 may also be similar to the overall shape of the display device 10. FIG. 1 illustrates that the display device 10 has a rectangular shape with longer sides in a second direction DR2.

The display device 10 may include a display area DPA and a non-display area NDA. In the display area DPA, images can be displayed. In the non-display area NDA, images are not displayed. The display area DPA may be referred to as an active area, while the non-display area NDA may also be referred to as an inactive area. The display area DPA may generally occupy the majority of the center of the display device 10.

The display area DPA may include pixels PX. The pixels PX may be arranged in a matrix. The shape of each pixel PX may be, but is not limited to, a rectangle or a square in a plan view. Each pixel may have a rhombic shape having sides inclined with respect to a direction. The pixels PX may be arranged in a stripe or island pattern. Each of the pixels PX may include one or more light-emitting elements each emitting light of a particular wavelength band to represent a color.

The non-display area NDA may be disposed around the display area DPA. The non-display area NDA may surround the display area DPA entirely or partially. The display area DPA may have a rectangular shape, and the non-display area NDA may be disposed to be adjacent to the four sides of the display area DPA. The non-display area NDA may form the bezel of the display device 10. Lines or circuit drivers included in the display device 10 may be disposed in the non-display area NDA, or external devices may be mounted in the non-display area NDA.

Figure 2:
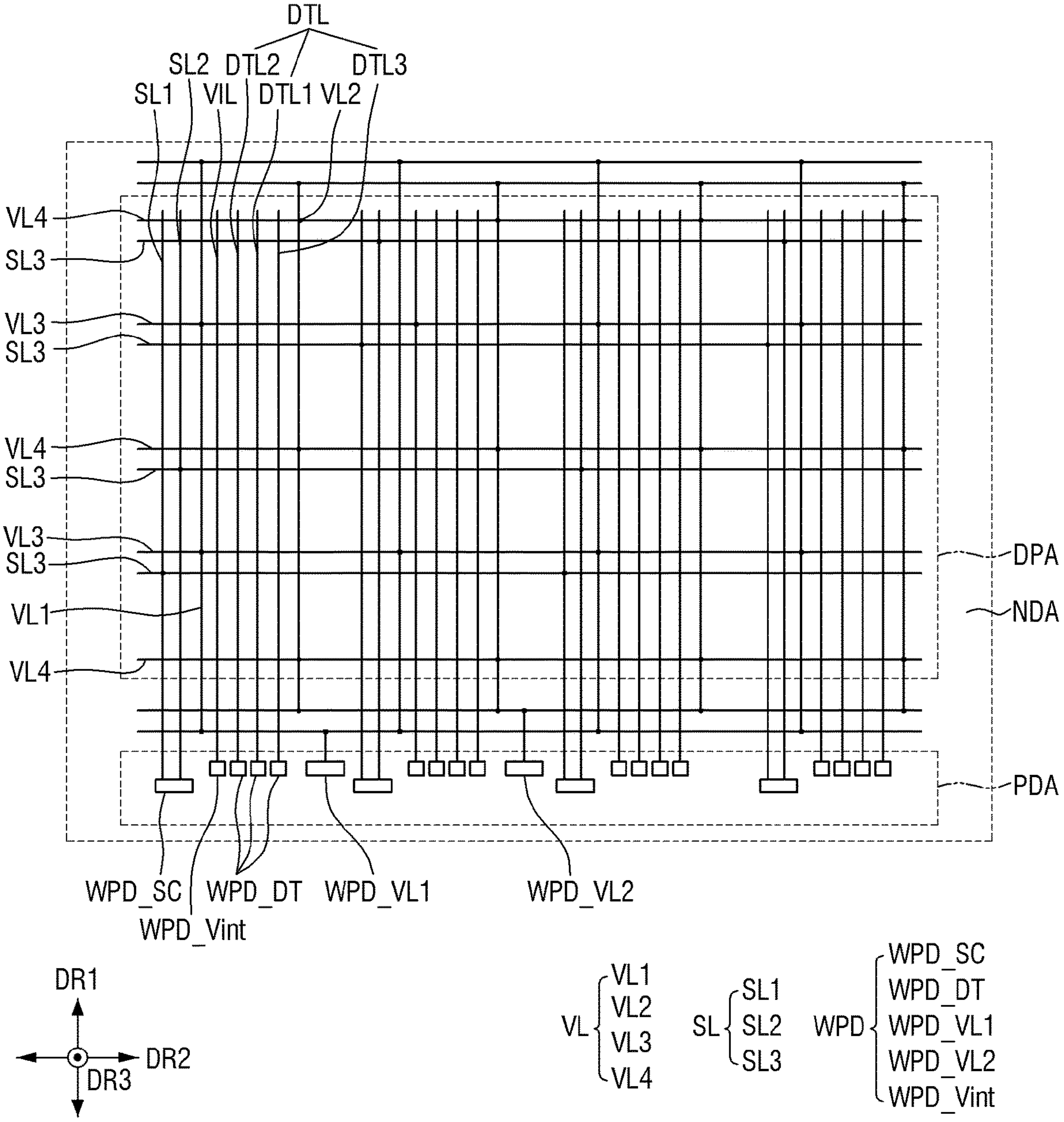
FIG. 2 is a schematic plan view showing arrangement of lines included in a display device according to an embodiment of the disclosure.

FIG. 2 is a schematic plan view illustrating arrangement of lines included in a display device according to an embodiment of the disclosure.

Referring to FIG. 2, the display device 10 may include lines. The display device 10 may include scan lines SL (e.g., SL1, SL2 and SL3), data lines DTL (e.g., DTL1, DTL2 and DTL3), an initialization voltage line VIL, and voltage lines VL (e.g., VL1, VL2, VL3 and VL4). Although not shown in the drawings, other lines may be further disposed in the display device 10.

The first scan line SL1 and the second scan line SL2 may be extended in the first direction DR1. The first scan line SL1 and the second scan line SL2 may be disposed adjacent to each other, and may be spaced apart from other first and second scan lines SL1 and SL2 in the second direction DR2. The first scan line SL1 and the second scan line SL2 may be connected to a scan wire pad WPD_SC connected to a scan driver (not shown). The first scan line SL1 and the second scan line SL2 may be extended from a pad area PDA located in the non-display area NDA to the display area DPA.

The third scan line SL3 may be extended in the second direction DR2, and may be spaced apart from another third scan line SL3 in the first direction DR1. A third scan line SL3 may be connected to one or more first scan lines SL1 or one or more second scan lines SL2. According to an embodiment of the disclosure, the first scan line SL1 and the second scan line SL2 may be formed as a conductive layer that is disposed on a different layer from the third scan line SL3. The scan lines SL may have, but is not limited to, a mesh structure on the entire surface of the display area DPA.

As used herein, when an element is referred to as being "connected" or "coupled" to another element, it can be directly connected or coupled to the element or intervening elements may be present. In addition, such elements may be understood as a single integrated element with one portion thereof connected to another portion. Moreover, when an element is referred to as being "connected" to another element, it may directly contact the element and also electrically connected to the element.

The data lines DTL may be extended in the first direction DR1. The data lines DTL may include a first data line DTL1, a second data line DTL2 and a third data line DTL3. The first to third data lines DTL1, DTL2 and DTL3 are disposed adjacent to one another as a group. The data lines DTL1, DTL2 and DTL3 may be extended from the pad area PDA located in the non-display area NDA to the display area DPA. It should be understood, however, that the disclosure is not limited thereto. The data lines DTL may be equally spaced apart from one another between a first voltage line VL1 and a second voltage line VL2 to be described below.

The initialization voltage line VIL may be extended in the first direction DR1. The initialization voltage line VIL may be disposed between the data lines DTL and the first and second scan lines SL1 and SL2. The initialization voltage line VIL may be extended from the pad area PDA located in the non-display area NDA to the display area DPA.

The first voltage line VL1 and the second voltage line VL2 may be extended in the first direction DR1, and the third voltage line VL3 and the fourth voltage line VL4 may be extended in the second direction DR2. The first voltage line VL1 and the second voltage line VL2 may be arranged alternately in the second direction DR2, and the third voltage line VL3 and the fourth voltage line VL4 may be arranged alternately in the first direction DR1. The first voltage lines VL1 and the second voltage lines VL2 may be extended in the first direction DR1 and may traverse the display area DPA. Some of the third voltage line VL3 and the fourth voltage lines VL4 may be disposed in the display area DPA while the others may be disposed in the non-display area NDA located on sides (or both sides) of the display area DPA in the first direction DR1. The first voltage lines VL1 and the second voltage lines VL2 may be formed as a conductive layer disposed on a different layer from the third voltage lines VL3 and the fourth voltage lines VL4. The first voltage line VL1 may be connected to at least one third voltage line VL3, and the second voltage line VL2 may be connected to at least one fourth voltage line VL4. The voltage lines VL may have a mesh structure in the entire display area DPA. It is, however, to be understood that the disclosure is not limited thereto.

The first scan lines SL1, the second scan lines SL2, the data lines DTL, the initialization voltage line VIL, the first voltage lines VL1 and the second voltage lines VL2 may be electrically connected to at least one wire pad WPD. The wire pads WPD may be disposed in the non-display areas NDA. According to the embodiment of the disclosure, the wire pads WPD may be disposed in the pad area PDA located on the lower side of the display area DPA that is the opposite side in the first direction DR1. The first and second scan lines SL1 and SL2 may be connected to the scan wire pad WPD_SC disposed in the pad area PDA, and the data lines DTL may be connected to different data wire pads WPD_DT, respectively. The initialization voltage line VIL may be connected to an initialization wire pad WPD_Vint, the first voltage line VL1 may be connected to a first voltage wire pad WPD_VL1, and the second voltage line VL2 may be connected to a second voltage wire pad WPD_VL2. External devices may be mounted on the wire pads WPD. External devices may be mounted on the wire pads WPD by an anisotropic conductive film, ultrasonic bonding, etc. Although FIG. 2 illustrates that the wire pads WPD are disposed in the pad area PDA located on the lower side of the display area DPA, the disclosure is not limited thereto. Some of the plurality of wire pads WPD may be disposed on the upper side or on one of the left and right sides of the display area DPA.

Each of the pixels PX or sub-pixels SPXn (where n is an integer of 1 to 3) of the display device 10 includes a pixel driving circuit. The above-described lines may pass through each of the pixels PX or the periphery thereof to apply a driving signal to the pixel driving circuit. The pixel driving circuit may include a transistor and a capacitor. The numbers of transistors and capacitors of each pixel driving circuit may be changed in a variety of ways. According to an embodiment of the disclosure, each of the sub-pixels SPXn of the display device 10 may have a 3T1C structure in which a pixel driving circuit includes three transistors and a capacitor. In the following description, the pixel driving circuit having the 3T1C structure will be described as an example. It is, however, to be understood that the disclosure is not limited thereto. A variety of modified structure may be employed such as a 2T1C structure, a 7T1C structure and a 6T1C structure.

Figure 3:
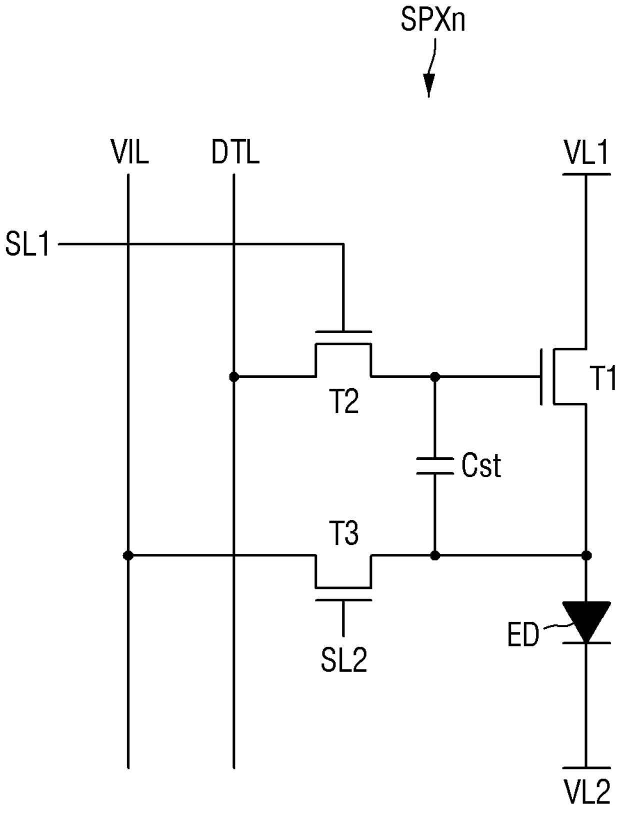
FIG. 3 is a schematic diagram of an equivalent circuit of a sub-pixel of a display device according to an embodiment of the disclosure.

FIG. 3 is a schematic diagram of an equivalent circuit of a sub-pixel according to an embodiment of the disclosure.

Referring to FIG. 3, each of the sub-pixels SPXn of the display device 10 according to an embodiment includes three transistors T1, T2 and T3 and a storage capacitor Cst in addition to a light-emitting element ED.

The light-emitting element ED emits light in proportion to the current supplied through the first transistor T1. The light-emitting element ED includes a first electrode, a second electrode, and at least one light-emitting element disposed therebetween. The light-emitting element may emit light in a particular wavelength range by an electric signal transmitted from the first electrode and the second electrode.

A first end of the light-emitting element ED may be connected to a source electrode of the first transistor T1, and a second end thereof may be connected to a second voltage line VL2 from which a low-level voltage (hereinafter referred to as a second supply voltage) lower than a high-level voltage (hereinafter referred to as a first supply voltage) of a first voltage line VL1 is applied.

The first transistor T1 adjusts a current flowing from the first voltage line VL1 from which the first supply voltage is supplied to the light-emitting element ED according to the voltage difference between a gate electrode and the source electrode. For example, the first transistor T1 may be a driving transistor for driving the light-emitting element ED. The gate electrode of the first transistor T1 may be connected to a source electrode of the second transistor T2, the source electrode thereof may be connected to the first electrode of the light-emitting element ED, and the drain electrode thereof may be connected to the first voltage line VL1 from which the first supply voltage is applied.

The second transistor T2 is turned on by a scan signal of the first scan line SL1 to connect the data line DTL with the gate electrode of the first transistor T1. The gate electrode of the second transistor T2 may be connected to the first scan line SL1, the source electrode thereof may be connected to the gate electrode of the first transistor T1, and the drain electrode thereof may be connected to the data line DTL.

A third transistor T3 may be turned on by a scan signal of a second scan line SL2 to connect the initialization voltage line VIL with the first end of the light-emitting element ED. The gate electrode of the third transistor T3 may be connected to the second scan line SL2, the drain electrode thereof may be connected to the initialization voltage line VIL, and the source electrode thereof may be connected to one end (or first end) of the light-emitting element ED or the source electrode of the first transistor T1.

Although FIG. 3 illustrates that the gate electrodes of the second transistor T2 and the third transistor T3 are electrically connected to different scan lines SL1 and SL2, respectively, the disclosure is not limited thereto. In some embodiments, the gate electrodes of the second transistor T2 and the third transistor T3 may be electrically connected to a same scan line.

The source electrode and the drain electrode of each of the transistors T1, T2 and T3 are not limited to those described above. They may be connected in the opposite way. Each of the transistors T1, T2 and T3 may be formed as a thin-film transistor. Although FIG. 3 illustrates that each of the transistors T1, T2 and T3 is implemented as an n-type metal-oxide-semiconductor field-effect transistor (MOSFET), the disclosure is not limited thereto. For example, each of the transistors T1, T2 and T3 may be implemented as a p-type MOSFET, or some of the transistors T1, T2 and T3 may be implemented as n-type MOSFETs while others thereof may be implemented as p-type MOSFETs.

The storage capacitor Cst is formed between the gate electrode and the source electrode of the first transistor T1. The storage capacitor Cst stores a voltage difference between the gate voltage and the source voltage of the first transistor T1.

Hereinafter, the structure of a pixel PX of the display device 10 according to an embodiment will be described in detail with reference to other drawings.

Figure 4:
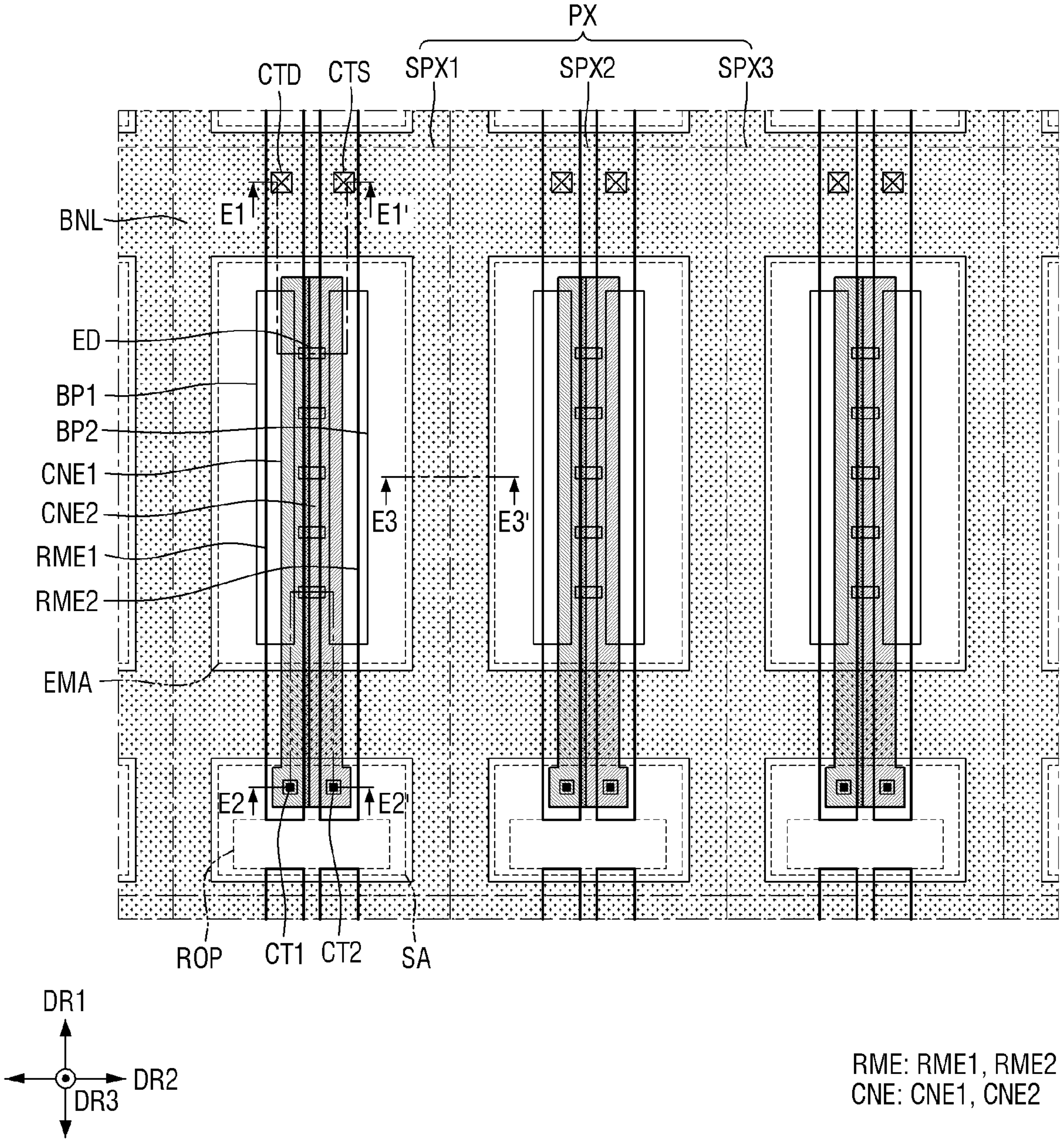
FIG. 4 is a schematic plan view showing a pixel of a display device according to an embodiment of the disclosure.

FIG. 4 is a schematic plan view illustrating a pixel of a display device according to an embodiment of the disclosure. FIG. 4 illustrates a layout of electrodes RME (RME1 and RME2), bank patterns BP1 and BP2, a bank layer BNL, light-emitting elements ED (ED1 and ED2), and connection electrodes CNE (CNE1 and CNE2) disposed in a pixel PX of a display device 10 in a plan view.

Referring to FIG. 4, each of the pixels PX of the display device 10 may include sub-pixels SPXn. For example, a pixel PX may include a first sub-pixel SPX1, a second sub-pixel SPX2 and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. It is, however, to be understood that the disclosure is not limited thereto. All the sub-pixels SPXn may emit light of the same color. According to an embodiment of the disclosure, the sub-pixels SPXn may emit blue light. Although the single pixel PX includes three sub-pixels SPXn in the example shown in the drawings, the disclosure is not limited thereto. The pixel PX may include more than three sub-pixels SPXn.

Each of the sub-pixels SPXn of the display device 10 may include an emission area EMA and a non-emission area. In the emission area EMA, light-emitting elements ED are disposed to emit light of a particular wavelength band. In the non-emission area, the light-emitting elements ED are not disposed and light emitted from the light-emitting elements ED do not reach, and thus no light exits therefrom.

The emission area EMA may include an area in which the light-emitting elements ED are disposed, and may include an area which is adjacent to the light-emitting elements ED and from which light emitted from the light-emitting elements ED exits. For example, the emission area EMA may also include an area in which light emitted from the light-emitting elements ED is reflected or refracted by other elements to exit. The light-emitting elements ED may be disposed in each of the sub-pixels SPXn, and the emission area EMA may include the area where the light-emitting elements are disposed and the adjacent area.

Although the emission areas EMA of the sub-pixels SPXn have the uniform area in the example shown in the drawings, the disclosure is not limited thereto. In some embodiments, the emission areas EMA of the sub-pixels SPXn may have different areas depending on a color or wavelength band of light emitted from the light-emitting elements ED disposed in the respective sub-pixels.

Each of the sub-pixels SPXn may further include a subsidiary area SA disposed in the non-emission area. The subsidiary area SA of each sub-pixel SPXn may be disposed on the lower side of the emission area EMA that is the opposite side in the first direction DR1. The emission areas EMA and the subsidiary areas SA may be arranged alternately in the first direction DR1, and each subsidiary area SA may be disposed between the emission areas EMA of different sub-pixels SPXn spaced apart from each other in the first direction DR1. For example, the emission areas EMA and the subsidiary areas SA may be alternately arranged in the first direction DR1, and the emission areas EMA and the subsidiary areas SA may be repeatedly arranged in the second direction DR2. It is, however, to be understood that the disclosure is not limited thereto. The emission areas EMA and the subsidiary areas SA of the pixels PX may have an arrangement different from that of FIG. 4.

No light-emitting diode ED is disposed in the subsidiary areas SA and thus no light exits therefrom. The electrodes RME disposed in the sub-pixels SPXn may be partially disposed in the subsidiary areas SA. The electrodes RME disposed in different sub-pixels SPXn may be disposed separately from one another at separation regions ROP of the subsidiary areas SA.

The lines and circuit elements of the circuit layer disposed in each pixel PX and connected to the light-emitting elements ED may be connected to the first to third sub-pixels SPX1, SPX2 and SPX3. It should be noted that the lines and circuit elements may not be disposed in the area occupied by each sub-pixel SPXn or the emission area EMA but may be disposed regardless of the location of the emission area EMA in a pixel PX.

The bank layer BNL may be disposed to surround the sub-pixels SPXn, the emission area EMA and the subsidiary area SA. The bank layer BNL may be disposed at the boundary between the sub-pixels SPXn adjacent to each other in the first direction DR1 and the second direction DR2, and may also be disposed at the boundary between the emission area EMA and the subsidiary area SA. The sub-pixels SPXn, the emission areas EMA and the subsidiary areas SA of the display device 10 may be distinguished from one another by the bank layer BNL. The distance between the sub-pixels SPXn, the emission areas EMA and the subsidiary areas SA may vary depending on the width of the bank layer BNL.

The bank layer BNL may be disposed in a lattice pattern on the front surface of the display area DPA and include portions extended in the first direction DR1 and the second direction DR2 in a plan view. The bank layer BNL may be disposed along the border of each of the sub-pixels PXn to distinguish between adjacent sub-pixels PXn. The bank layer BNL may be disposed to surround the emission area EMA and the subsidiary area SA disposed in each of the sub-pixels SPXn to distinguish between them.

Figure 5:
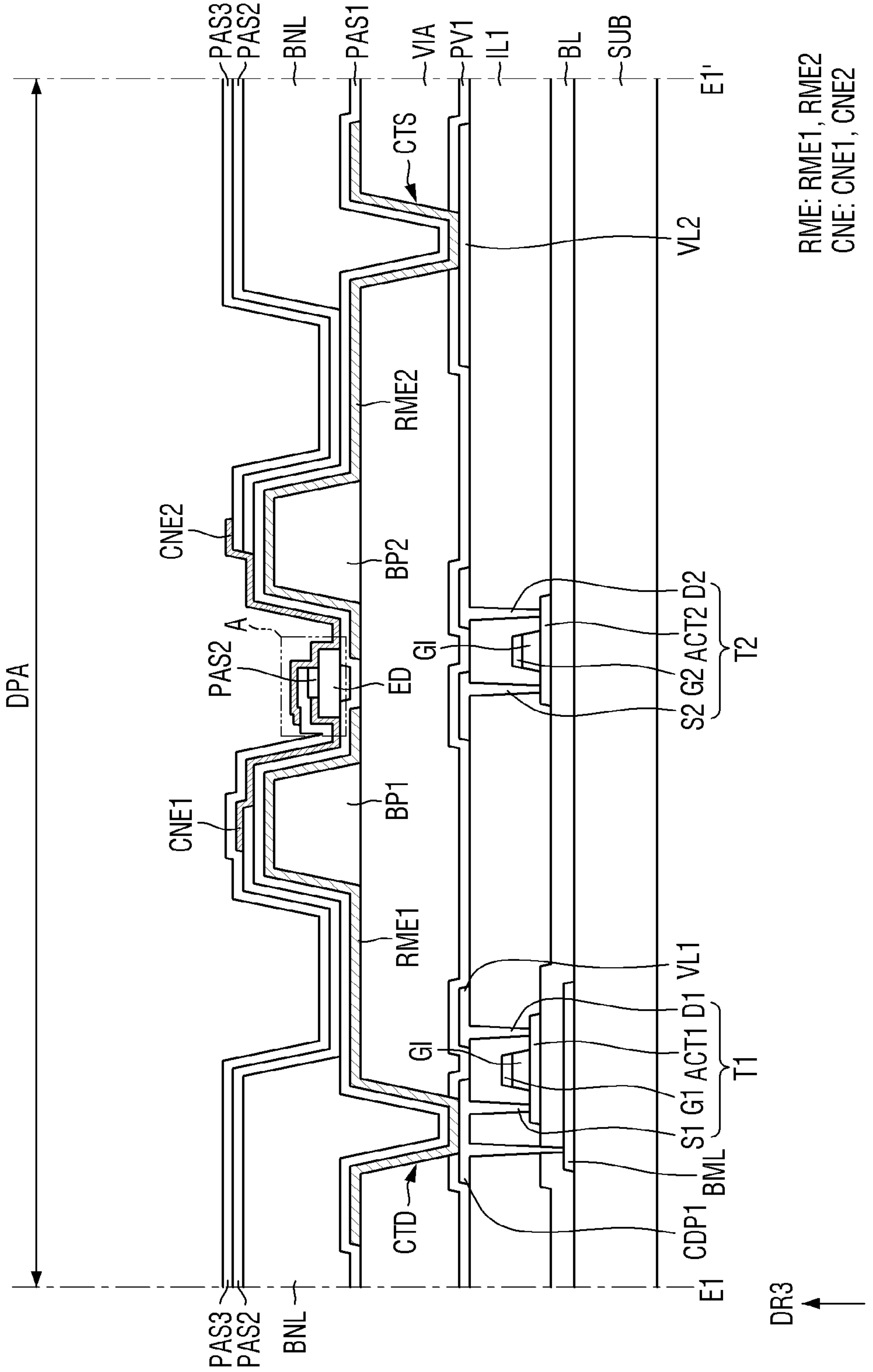
FIG. 5 is a schematic cross-sectional view taken along line E1-E1' of FIG. 4.
Figure 6:
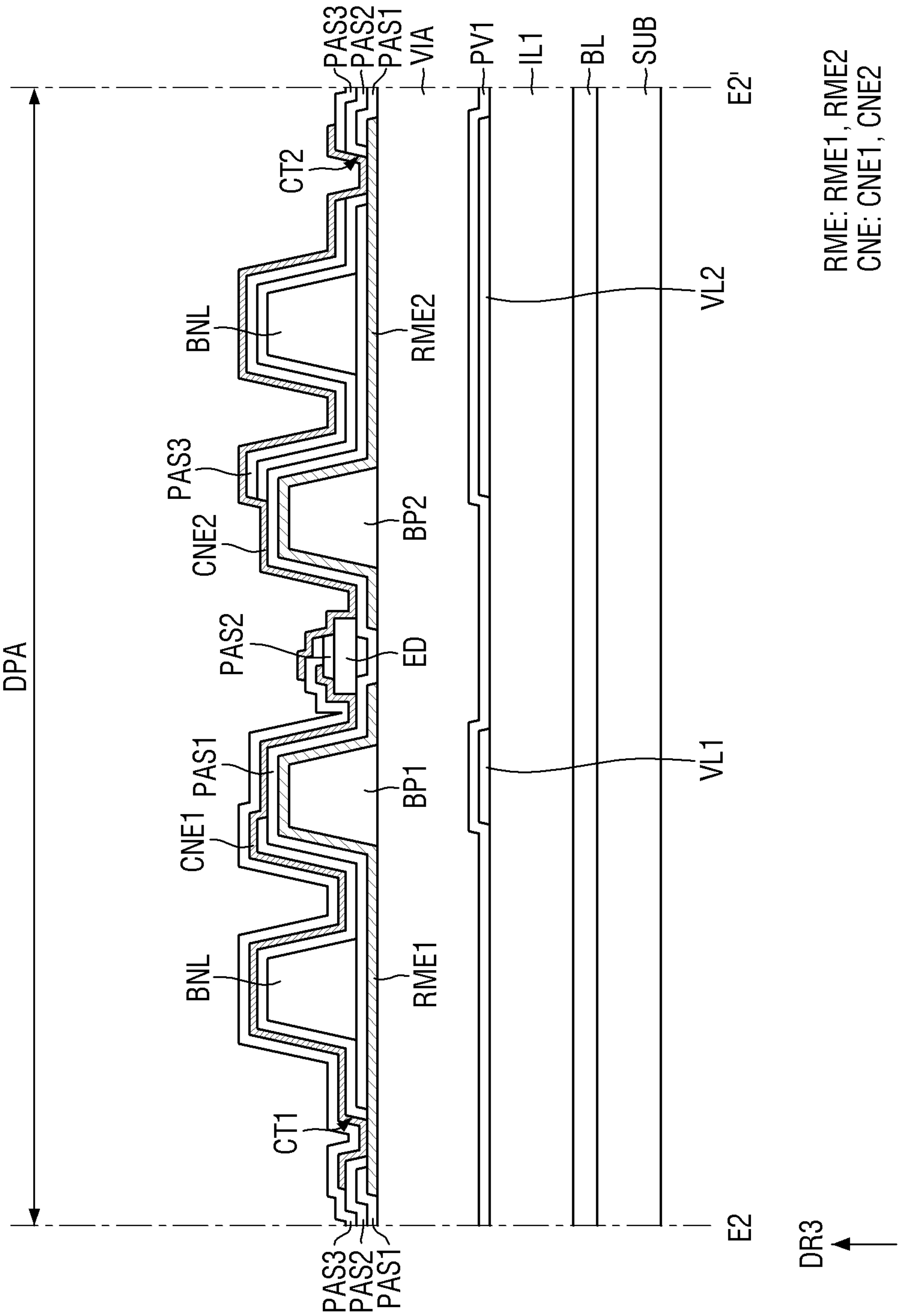
FIG. 6 is a schematic cross-sectional view taken along line E2-E2' of FIG. 4.
Figure 7:
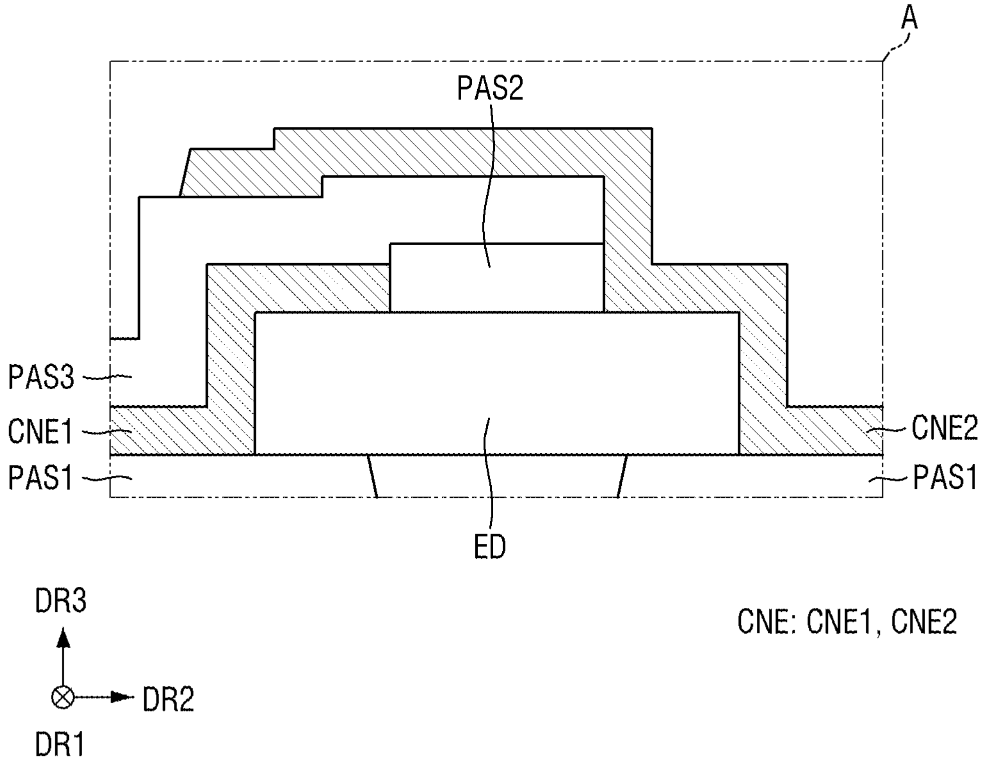
FIG. 7 is a schematic enlarged cross-sectional view of area A of FIG. 5.
Figure 8:
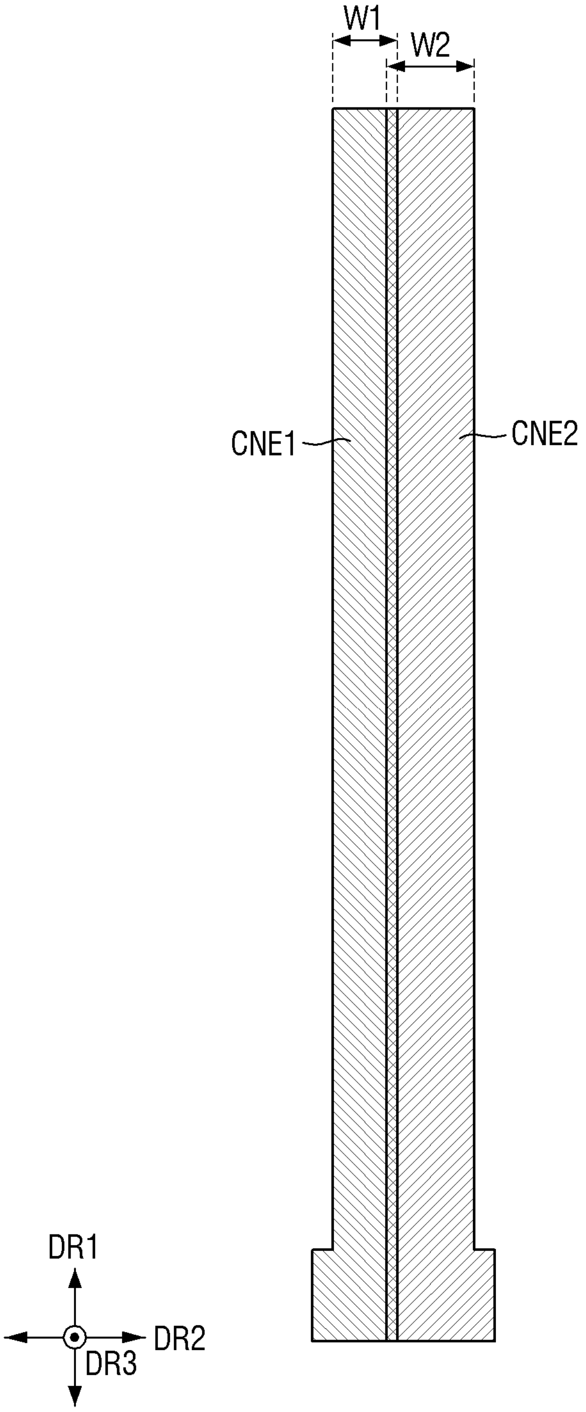
FIG. 8 is a schematic plan view showing a first connection electrode and a second connection electrode of a display device according to an embodiment.

FIG. 5 is a schematic cross-sectional view taken along line E1-E1' of FIG. 4. FIG. 6 is a schematic cross-sectional view taken along line E2-E2' of FIG. 4. FIG. 7 is a schematic enlarged cross-sectional view of area A of FIG. 5. FIG. 8 is a schematic plan view illustrating a first connection electrode and a second connection electrode of a display device according to an embodiment.

FIG. 5 illustrates a cross section across ends of the light-emitting elements ED disposed in the first sub-pixel SPX1 and electrode contact holes CTD and CTS, and FIG. 6 illustrates a cross section across ends of the light-emitting elements ED disposed in the first sub-pixel SPXn and contacts CT1 and CT2.

Referring to FIGS. 4 and 5 to 8, the display device 10 may include a substrate SUB, and a semiconductor layer, conductive layers and insulating layers disposed thereon. The display device 10 may include electrodes RME (e.g., RME1 and RME2), light-emitting elements ED, and connection electrodes CNE (e.g., CNE1 and CNE2). The semiconductor layer, the conductive layers and the insulating layers may form a circuit layer of the display device 10.

The substrate SUB may be an insulating substrate. The substrate SUB may be made of an insulating material such as glass, quartz and a polymer resin. The substrate SUB may be either a rigid substrate or a flexible substrate that can be bent, folded, or rolled. The substrate SUB may include the display area DPA and the non-display area NDA surrounding the display area DPA. The display area DPA may include the emission area EMA and the subsidiary area SA which is a portion of the non-emission area.

A first conductive layer may be disposed on the substrate SUB. The first conductive layer includes a bottom metal layer BML. The bottom metal layer BML is disposed to overlap an active layer ACT1 of a first transistor T1. The bottom metal layer BML may prevent light from being incident on the first active layer ACT1 of the first transistor or may be electrically connected to the first active layer ACT1 to stabilize the electrical characteristics of the first transistor T1. It is, however, to be noted that the bottom metal layer BML may be eliminated.

A buffer layer BL may be disposed on the bottom metal layer BML and the substrate SUB. The buffer layer BL may be formed on the substrate SUB to protect the transistors of the pixels PX from moisture permeating through the substrate SUB that is susceptible to moisture permeation, and may also provide a flat surface.

The semiconductor layer is disposed on the buffer layer BL. The semiconductor layer may include the first active layer ACT1 of the first transistor T1 and the second active layer ACT2 of the second transistor T2. The first active layer ACT1 and the second active layer ACT2 may be disposed to partially overlap the first gate electrode G1 and the second gate electrode G2 of a second conductive layer, respectively, which will be described below.

The semiconductor layer may include polycrystalline silicon, monocrystalline silicon, an oxide semiconductor, etc. In other embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), indium-gallium zinc tin oxide (IGZTO), etc.

Although the first transistor T1 and the second transistor T2 are disposed in the sub-pixel SPXn of the display device 10 in the drawings, the disclosure is not limited thereto. A larger number of transistors may be included in the display device 10.

A first gate insulating layer GI is disposed on the semiconductor layer in the display area DPA. The first gate insulating layer GI may work as a gate insulating film of the transistors T1 and T2. FIG. 5 illustrates that the first gate insulating layer GI is patterned together with the gate electrodes G1 and G2 of the second conductive layer to be described below, and is partially disposed between the second conductive layer and the active layers ACT1 and ACT2 of the semiconductor layer. It should be understood, however, that the disclosure is not limited thereto. In some embodiments, the first gate insulating layer GI may be disposed entirely on the semiconductor layer and the buffer layer BL.

The second conductive layer is disposed on the first gate insulating layer GI. The second conductive layer may include a first gate electrode G1 of the first transistor T1, and a second gate electrode G2 of the second transistor T2. The first gate electrode G1 may overlap a channel region of the first active layer ACT1 in the third direction DR3, which is the thickness direction. The second gate electrode G2 may overlap a channel region of the second active layer ACT2 in the third direction DR3, which is the thickness direction. Although not shown in the drawings, the second conductive layer may further include an electrode of a storage capacitor.

A first interlayer insulating layer IL1 is disposed on the second conductive layer. The first interlayer insulating layer IL1 may work as an insulating film between the second conductive layer and other layers disposed thereon and can protect the second conductive layer.

The third conductive layer is disposed on the first interlayer insulating layer IL1. The third conductive layer may include the first voltage line VL1 and the second voltage line VL2 disposed in the display area DPA, a first conductive pattern CDP1, and the source electrodes S1 and S2 and drain electrodes D1 and D2 of the transistors T1 and T2. Although not shown in the drawings, the third conductive layer may further include another electrode of the storage capacitor.

A high-level voltage (or a first supply voltage) may be applied to the first voltage line VL1 to be transmitted to the first electrode RME1, and a low-level voltage (or a second supply voltage) may be applied to the second voltage line VL2 to be transmitted to the second electrode RME2. A portion of the first voltage line VL1 may contact the first active layer ACT1 of the first transistor T1 through a contact hole penetrating the first interlayer insulating layer IL1 and the first gate insulating layer GI. The first voltage line VL1 may work as the drain electrode D1 of the first transistor T1. The second voltage line VL2 may be directly connected to the second electrode RME2 to be described below.

The first conductive pattern CDP1 may contact the first active layer ACT1 of the first transistor T1 through a contact hole penetrating the first interlayer insulating layer IL1 and the first gate insulating layer GI. The first conductive pattern CDP1 may contact the bottom metal layer BML through another contact hole. The first conductive pattern CDP1 may work as a source electrode S1 of the first transistor T1. The first conductive pattern CDP1 may be connected to a first electrode RME1 or a first connection electrode CNE1 to be described below. The first transistor T1 may transfer the first supply voltage applied from the first voltage line VL1 to the first electrode RME1 or the first connection electrode CNE1.

The second source electrode S2 and the second drain electrode D2 may contact the second active layer ACT2 of the second transistor T2 through contact holes penetrating the first interlayer insulating layer IL1 and the first gate insulating layer GI, respectively. The second transistor T2 may be at least one of the switching transistors described above with reference to FIG. 3. The second transistor T2 may transmit a signal applied from the data line DTL of FIG. 3 to the first transistor T1 or may transmit a signal applied from the initialization voltage line VIL of FIG. 3 to another electrode of the storage capacitor.

A first passivation layer PV1 is disposed over the third conductive layer. The first passivation layer PV1 may work as an insulating film between the third conductive layer and other layers and can protect the third conductive layer.

The buffer layer BL, the first gate insulating layer GI, the first interlayer insulating layer IL1 and the first passivation layer PV1 may be made up of multiple inorganic layers stacked on one another alternately. For example, the buffer layer BL, the first gate insulating layer GI, the first interlayer insulating layer IL1 and the first passivation layer PV1 may be made up of a double layer in which inorganic layers including at least one of silicon oxide ($SiO_x$), silicon nitride ($SiN_x$) and silicon oxynitride (SiON) are stacked on one another or multiple layers in which they are alternately stacked on one another. It is, however, to be understood that the disclosure is not limited thereto. The buffer layer BL, the first gate insulating layer GI, the first interlayer insulating layer IL1 and the first passivation layer PV1 may be made up of a single inorganic layer including the above-described insulating material. In some embodiments, the first interlayer insulating layer IL1 may be made of an organic insulating material such as polyimide (PI).

A via layer VIA is disposed on the first passivation layer PV1 in the display area DPA. The via layer VIA may include an organic insulating material, e.g., polyimide (PI), to compensate for a step difference (or height difference) due to conductive layers therebelow and provide a flat upper surface. It should be noted that the via layer VIA may be eliminated in some embodiments.

The display device 10 may include the bank patterns BP1 and BP2, the electrodes RME (e.g., RME1 and RME2), the bank layer BNL, the light-emitting elements ED, and the connection electrodes CNE (e.g., CNE1 and CNE2) as a display element layer disposed on the via layer VIA. The display device 10 may include insulating layers PAS1, PAS2 and PAS3 disposed on the via layer VIA.

The bank patterns BP1 and BP2 may be disposed in the emission area EMA of each sub-pixel SPX. Each of the bank patterns BP1 and BP2 may have a shape that has a constant width in the second direction DR2 and is extended in the first direction DR1.

For example, the bank patterns BP1 and BP2 may include a first bank pattern BP1 and a second bank pattern BP2 spaced apart from each other in the second direction DR2 in the emission area EMA of each sub-pixel SPXn. The first bank pattern BP1 may be disposed on the left side of the center of the emission area EMA that is a side in the second direction DR2, and the second bank pattern BP2 may be spaced apart from the first bank pattern BP1 and may be disposed on the right side of the center of the emission area EMA that is the opposite side in the second direction DR2. The first bank pattern BP1 and the second bank pattern BP2 may be alternately arranged in the second direction DR2 and may be disposed in an island-like pattern in the display area DPA. The light-emitting elements ED may be disposed between the first bank pattern BP1 and the second bank pattern BP2.

The length of the first bank pattern BP1 may be equal to the length of the second bank pattern BP2 in the first direction DR1. The lengths of the first bank pattern BP1 and the second bank pattern BP2 may be smaller than the length of the emission area EMA surrounded by the bank layer BNL in the first direction DR1. The first bank pattern BP1 and the second bank pattern BP2 may be spaced apart from a portion of the bank layer BNL that is extended in the second direction DR2. It should be understood, however, that the disclosure is not limited thereto. The bank patterns BP1 and BP2 may be integrated with the bank layer BNL or may partially overlap a portion of the bank layer BNL that is extended in the second direction DR2. The lengths of the bank patterns BP1 and BP2 in the first direction DR1 may be equal to or greater than the length of the emission area EMA surrounded by the bank layer BNL in the first direction DR1.

The first bank pattern BP1 and the second bank pattern BP2 may have a same width in the second direction DR2. It should be understood, however, that the disclosure is not limited thereto. They may have different widths. For example, one of the bank patterns may have a greater width than another, and the another bank pattern may be disposed across the emission areas EMA of different sub-pixels SPXn adjacent to each other in the second direction DR2. In case that the bank patterns are disposed across the emission areas EMA, portions of the bank layer BNL extended in the first direction DR1 may overlap the second bank pattern BP2 in the thickness direction. Although two bank patterns BP1 and BP2 are disposed in each sub-pixel SPXn and have the same width in the example shown in the drawings, the disclosure is not limited thereto. The number and shape of the bank patterns BP1 and BP2 may vary depending on the number or arrangement structure of the electrodes RME.

The bank patterns BP1 and BP2 may be disposed on the via layer VIA. For example, the bank patterns BP1 and BP2 may be disposed directly on the via layer VIA, and may have a structure that at least partly protrudes from the upper surface of the via layer VIA. The protruding portions of the bank patterns BP1 BP2 may have inclined or bent side surfaces. The light emitted from the light-emitting elements ED may be reflected by the electrodes RME disposed on the bank patterns BP1 and BP2 so that the light may exit toward the upper side of the via layer VIA. Unlike that shown in the drawings, the bank patterns BP1 and BP2 may have an outer surface with a curvature or a semi-circular or semi-elliptical shape in a cross-sectional view. The bank patterns BP1 and BP2 may include, but is not limited to, an organic insulating material such as polyimide (PI).

The electrodes RME (e.g., RME1 and RME2) have a shape extended in a direction and are disposed in each of the sub-pixels SPXn. The electrodes RME1 and RME2 may be extended in the first direction DR1 to be disposed in the emission area EMA and the subsidiary area SA of the sub-pixel SPXn, and they may be spaced apart from one another in the second direction DR2. The electrodes RME may be electrically connected to the light-emitting elements ED, which will be described below. It should be understood, however, that the disclosure is not limited thereto. The electrodes RME may not be electrically connected to the light-emitting elements ED.

The display device 10 may include a first electrode RME1 and a second electrode RME2 disposed in each of the sub-pixels SPXn. The first electrode RME1 is disposed on the left side of the center of the emission area EMA, and the second electrode RME2 is spaced apart from the first electrode RME1 in the second direction DR2 and is disposed on the right side of the center of the emission area EMA. The first electrode RME1 may be disposed on the first bank pattern BP1, and the second electrode RME2 may be disposed on the second bank pattern BP2. The first electrode RME1 and the second electrode RME2 may be extended beyond the bank layer BNL and may be partially disposed in the sub-pixel SPXn and the subsidiary area SA. The first electrode RME1 and the second electrode RME2 of a sub-pixel SPXn may be spaced apart from those of another sub-pixel SPXn at the separation region ROP located in the subsidiary area SA of one of the sub-pixels SPXn.

Although two electrodes RME are disposed in each sub-pixel SPXn and have a shape extended in the first direction DR1 in the drawings, but the disclosure is not limited thereto. For example, more than two electrodes RME may be disposed in a single sub-pixel SPXn of the display device 10, or the electrodes RME may be partially bent and may have varying widths in a direction.

The first electrode RME1 and the second electrode RME2 may be disposed on at least inclined side surfaces of the bank patterns BP1 and BP2. According to an embodiment of the disclosure, the width of the electrodes RME measured in the second direction DR2 may be smaller than the width of the bank patterns BP1 and BP2 measured in the second direction DR2. The distance between the first electrode RME1 and the second electrode RME2 spaced apart from each other in the second direction DR2 may be smaller than the distance between the bank patterns BP1 and BP2. At least portions of the first electrode RME1 and the second electrode RME2 may be disposed directly on the via layer VIA, so that they may be disposed on a same plane.

The light-emitting elements ED disposed between the bank patterns BP1 and BP2 may emit light through ends thereof. The emitted light may be directed to the electrodes RME disposed on the bank patterns BP1 and BP2. The portion of each of the electrodes RME that is disposed on the bank patterns BP1 and BP2 may reflect light emitted from the light-emitting elements ED. The first electrode RME1 and the second electrode RME2 may be disposed to cover at least one side surface of the bank patterns BP1 and BP2 to reflect light emitted from the light-emitting elements ED.

Each of the electrodes RME may directly contact the third conductive layer through the electrode contact holes CTD and CTS where it overlaps the bank layer BNL between the emission area EMA and the subsidiary area SA.

The first electrode contact hole CTD may be formed where the bank layer BNL and the first electrode RME1 overlap each other. The second electrode contact hole CTS may be formed where the bank layer BNL and the second electrode RME2 overlap each other. The first electrode RME1 may contact the first conductive pattern CDP1 through the first electrode contact hole CTD penetrating through the via layer VIA and the first passivation layer PV1. The second electrode RME2 may contact the second voltage line VL2 through the second electrode contact hole CTS penetrating through the via layer VIA and the first passivation layer PV1. The first electrode RME1 may be electrically connected to the first transistor T1 through the first conductive pattern CDP1 to receive the first supply voltage. The second electrode RME2 may be electrically connected to the second voltage line VL2 to receive the second supply voltage. It is, however, to be understood that the disclosure is not limited thereto. According to another embodiment, each of the electrodes RME1 and RME2 may not be electrically connected to the voltage lines VL1 and VL2 of the third conductive layer, and connection electrodes CNE to be described below may be directly connected to the third conductive layer.

Each of the electrodes RME may include a conductive material having a high reflectance. For example, the electrodes RME may include a metal such as silver (Ag), copper (Cu) and aluminum (Al), or may include at least one of an alloy including aluminum (Al), nickel (Ni), lanthanum (La), and the like, or a stack of a metal layer such as titanium (Ti), molybdenum (Mo) and/or niobium (Nb) and the alloy thereof. In some embodiments, the electrodes RME may be made up of a double- or multi-layer in which an alloy containing aluminum (Al) and at least one metal layer made of titanium (Ti), molybdenum (Mo), and niobium (Nb) are stacked on one another.

It is, however, to be understood that the disclosure is not limited thereto. The electrodes RME may further include a transparent conductive material. For example, each of the electrodes RME may include a material such as ITO, IZO and ITZO. In some embodiments, each of the electrodes RME1 and RME2 may have a structure in which one or more layers of a transparent conductive material and one or more metal layers having high reflectivity are stacked on one another, or may be made up of a single layer including them. For example, each of the electrodes RME may have a stack structure such as ITO/Ag/ITO/, ITO/Ag/IZO, or ITO/Ag/ITZO/IZO. The electrodes RME may be electrically connected to the light-emitting elements ED and may reflect some of rays of light emitted from the light-emitting elements ED toward the upper side of the substrate SUB.

The first insulating layer PAS1 may be disposed on the front surface of the display area DPA, and may be disposed on the via layer VIA and the electrodes RME. The first insulating layer PAS1 may include an insulating material, can protect the electrodes RME and can insulate different electrodes RME from each other. As the first insulating layer PAS1 is disposed to cover the electrodes RME before the bank layer BNL is formed, it is possible to prevent the electrode RME from being damaged during the process of forming the bank layer BNL. The first insulating layer PAS1 can also prevent the light-emitting elements ED disposed thereon from being brought into direct contact with other elements and damaged.

In an embodiment, the first insulating layer PAS1 may have a step or steps so that a portion of the upper surface is recessed between the electrodes RME spaced apart from one another in the second direction DR2. The light-emitting elements ED may be disposed on the upper surface of the first insulating layer PAS1 in which the step is formed, and space may be formed between the light-emitting elements ED and the first insulating layer PAS1.

According to the embodiment of the disclosure, the first insulating layer PAS1 may include separation openings OPR and contacts CT1 and CT2. The first insulating layer PAS1 may include the separation openings OPR formed to correspond to (or in line with) the separation regions ROP of the subsidiary areas SA, and contacts CT1 and CT2 formed where the connection electrodes CNE to be described below are connected to the electrodes RME. The first insulating layer PAS1 may be disposed entirely on the via layer VIA, and the underlying layers may be partially exposed where the contacts CT1 and CT2 are formed and where the separation regions ROP of the subsidiary areas SA are formed.

The contacts CT1 and CT2 formed in the first insulating layer PAS1 may overlap different electrodes RME, respectively. For example, the contacts CT1 and CT2 may include first contacts CT1 overlapping the first electrode RME1, and second contacts CT2 overlapping the second electrode RME2, which are disposed in the subsidiary area SA. The first contacts CT1 and the second contacts CT2 may penetrate the first insulating layer PAS1 to expose a portion of the upper surface of the first electrode RME1 or the second electrode RME2 disposed thereunder. Each of the first contact CT1 and the second contact CT2 may further penetrate some of the other insulating layers disposed on the first insulating layer PAS. The electrodes RME exposed by the contacts CT1 and CT2 may contact the connection electrodes CNE.

The bank layer BNL may be disposed on the first insulating layer PAS1. The bank layer BNL may include portions extended in the first direction DR1 and the second direction DR2 and may surround each of the sub-pixels SPXn. The bank layer BNL may surround the emission area EMA and the subsidiary area SA of each of the sub-pixels SPXn to distinguish between them, and may surround the border of the display area DPA to distinguish between the display area DPA and the non-display area NDA. The bank layer BNL may be disposed in the entire display area DPA to form a lattice pattern. The area opened by the bank layer BNL in the display area DPA may be the emission area EMA and the subsidiary area SA.

The bank layer BNL may have a height similar to that of the bank patterns BP1 and BP2 and may have a generally uniform height. In some embodiments, the top surface of the bank layer BNL may have a height higher than that of the bank patterns BP1 and BP2, and the thickness thereof may be equal to or greater than the thicknesses of the bank patterns BP1 and BP2. The bank layer BNL can prevent an ink from overflowing into adjacent sub-pixels SPXn during an inkjet printing process of the process of fabricating the display device 10. The bank layer BNL may include an organic insulating material such as polyimide, similar to the bank patterns BP1 and BP2.

The light-emitting elements ED may be disposed in the emission area EMA. The light-emitting elements ED may be disposed between the bank patterns BP1 and BP2 and may be spaced apart from one another in the first direction DR1. According to an embodiment of the disclosure, the light-emitting elements ED may have a shape extended in a direction, and ends of light-emitting elements ED may be disposed on different electrodes RME, respectively. The length of the light-emitting elements ED may be larger than the distance between the electrodes RME spaced apart from each other in the second direction DR2. The direction in which the light-emitting elements ED are generally extended may be perpendicular to the first direction DR1 in which the electrodes RME are extended. It is, however, to be understood that the disclosure is not limited thereto. The direction in which the light-emitting elements ED are extended may face the second direction DR2 or a direction obliquely thereto.

The light-emitting elements ED may be disposed on the first insulating layer PAS1. The light-emitting elements ED may be extended in a direction, and the direction may be parallel to the upper surface of the substrate SUB. As will be described below, the light-emitting elements ED may include semiconductor layers arranged in the extended direction. The semiconductor layers may be sequentially arranged in a direction parallel to the upper surface of the substrate SUB. It should be understood, however, that the disclosure is not limited thereto. In case that the light-emitting elements ED have a different structure, semiconductor layers may be disposed in a direction perpendicular to the substrate SUB.

The light-emitting elements ED disposed in each of the sub-pixels SPXn may emit light of different wavelength bands depending on the material of the semiconductor layer. It is, however, to be understood that the disclosure is not limited thereto. The light-emitting elements ED disposed in each of the sub-pixels SPXn may include the semiconductor layers made of a same material and may emit light of a same color.

The light-emitting elements ED may be electrically connected to the electrodes RME and the conductive layers under the via layer VIA by contacting the connection electrodes CNE (CNE1 and CNE2), and an electric signal may be applied to it so that light of a particular wavelength range can be emitted.

The second insulating layer PAS2 may be disposed on the light-emitting elements ED, the first insulating layer PAS1 and the bank layer BNL. The second insulating layer PAS2 may be extended in the first direction DR1 between the bank patterns BP1 and BP2 and may include a pattern portion disposed on the light-emitting elements ED. The pattern portion may be disposed to partially surround the outer surface of the light-emitting elements ED, and may not cover sides or ends of the light-emitting elements ED. The pattern portion may form a linear or island pattern in each sub-pixel SPXn in a plan view. The pattern portion of the second insulating layer PAS2 can protect the light-emitting elements ED and can fix the light-emitting elements ED during the process of fabricating the display device 10 so that the light-emitting elements ED do not deviate. The second insulating layer PAS2 may be disposed to fill the space between light-emitting elements ED and the first insulating layer PAS1 thereunder. A portion of the second insulating layer PAS2 may be disposed on the bank layer BNL and in the subsidiary area SA.

According to the embodiment of the disclosure, the second insulating layer PAS2 may include openings corresponding to the separation region ROP of the substrate area SA and to the first and second ends of the light-emitting elements ED in the emission area EMA so that the underlying layers are exposed. The second insulating layer PAS2 may include contacts CT1 and CT2 formed where the connection electrodes CNE and the electrodes RME are connected. The second insulating layer PAS2 may be disposed entirely on the first insulating layer PAS1, and the underlying layers may be partially exposed where the openings are formed.

As the openings formed in the second insulating layer PAS2, in the openings formed to correspond to the separation regions ROP of the subsidiary areas SA, a process of separating the electrodes RME disposed thereunder from each other may be carried out. Similar to the first insulating layer PAS1, the second insulating layer PAS2 may also expose the upper surface of the via layer VIA in the separation region ROP in which the process of separating the electrodes RME is carried out.

The connection electrodes CNE (CNE1 and CNE2) may be disposed on the electrodes RME and the bank patterns BP1 and BP2. The connection electrodes CNE may each have a shape extended in a direction and may be spaced apart from one another. The connection electrodes CNE may contact the light-emitting elements ED and may be electrically connected to the third conductive layer.

The connection electrodes CNE may include a first connection electrode CNE1 and a second connection electrode CNE2 disposed in each sub-pixel SPXn. The first connection electrode CNE1 may have a shape extended in the first direction DR1 and may be disposed on the first electrode RME1 or the first bank pattern BP1. The first connection electrode CNE1 may partially overlap the first electrode RME1 and may be disposed from the emission area EMA to the subsidiary area SA beyond the bank layer BNL. The second connection electrode CNE2 may have a shape extended in the first direction DR1 and may be disposed on the second electrode RME2 or the second bank pattern BP2. The second connection electrode CNE2 may partially overlap the second electrode RME2 and may be disposed from the emission area EMA to the subsidiary area SA beyond the bank layer BNL. The first connection electrode CNE1 and the second connection electrodes CNE2 may contact the light-emitting elements ED and may be electrically connected to the electrodes RME or a conductive layer thereunder.

For example, each of the first connection electrode CNE1 and the second connection electrode CNE2 may be disposed on the second insulating layer PAS2 and may contact the light-emitting elements ED. The first connection electrode CNE1 may partially overlap the first electrode RME1 and may contact first ends of the light-emitting elements ED. The second connection electrode CNE2 may partially overlap the second electrode RME2 and may contact second ends of the light-emitting elements ED. The connection electrodes CNE are disposed across the emission area EMA and the subsidiary area SA. A portion of each of the connection electrodes CNE that is disposed in the emission area EMA may contact the light-emitting elements ED, and a portion thereof that is disposed in the subsidiary area SA may be electrically connected to the third conductive layer.

In the display device 10 according to the embodiment, each of the connection electrodes CNE may contact the electrodes RME through the contacts CT1 and CT2 located in the subsidiary area SA. The first connection electrode CNE1 may contact the first electrode RME1 through the first contact CT1 penetrating the first insulating layer PAS1 and the second insulating layer PAS2 in the subsidiary area SA. The second connection electrode CNE2 may contact the second electrode RME2 through the second contact CT2 penetrating the first insulating layer PAS1, the second insulating layer PAS2 and the third insulating layer PAS3 in the subsidiary area SA. The connection electrodes CNE may be electrically connected to the third conductive layer through the respective electrodes RME. The first connection electrode CNE1 may be electrically connected to the first transistor T1 to receive the first supply voltage, and the second connection electrode CNE2 may be electrically connected to the second voltage line VL2 to receive the second supply voltage. Each of the connection electrodes CNE may contact the light-emitting elements ED in the emission area EMA to transmit the supply voltage to the light-emitting elements ED.

It is, however, to be understood that the disclosure is not limited thereto. In some embodiments, the connection electrodes CNE may directly contact the third conductive layer, or may be electrically connected to the third conductive layer through other patterns than the electrodes RME.

The connection electrodes CNE may include a conductive material. For example, the connection electrodes CNE may include ITO, IZO, ITZO, aluminum (Al), etc. For example, the connection electrodes CNE may include a transparent conductive material, and light emitted from the light-emitting elements ED may transmit the connection electrodes CNE to exit.

The third insulating layer PAS3 is disposed on the first connection electrode CNE1 and the second insulating layer PAS2. The third insulating layer PAS3 may be disposed entirely on the second insulating layer PAS2 to cover the first connection electrode CNE1, and the second connection electrode CNE1 may be disposed on the third insulating layer PAS3. The third insulating layer PAS3 may insulate the second connection electrode CNE2 and the first connection electrode CNE1 from each other so that they do not directly contact each other.

The third insulating layer PAS3 may include second contacts CT2 formed where the first ends of the light-emitting elements ED are exposed, and where the second connection electrode CNE2 is connected to the second electrode RME2 in the subsidiary area SA. The second contacts CT2 may penetrate through the third insulating layer PAS3 in addition to the first insulating layer PAS1 and the second insulating layer PAS2. The second contacts CT2 may expose a portion of the upper surface of the first electrode RME1 thereunder.

Each of the above-described first insulating layer PAS1, second insulating layer PAS2 and third insulating layer PAS3 may include an insulating inorganic material or an insulating organic material. For example, each of the first insulating layer PAS1, the second insulating layer PAS2 and the third insulating layer PAS3 may include an insulating inorganic material, or the first insulating layer PAS1 and the third insulating layer PAS3 may include an insulating inorganic material while the second insulating layer PAS2 may include an inorganic organic material. Each of the first insulating layer PAS1, the second insulating layer PAS2 and the third insulating layer PAS3 or at least one of them may be formed in a structure in which insulating layers are alternately or repeatedly stacked on one another. According to an embodiment of the disclosure, each of the first insulating layer PAS1, the second insulating layer PAS2 and the third insulating layer PAS3 may be made of at least one of silicon oxide ($SiO_x$), silicon nitride ($SiN_x$), and silicon oxynitride ($SiO_xN_y$). The first insulating layer PAS1, the second insulating layer PAS2 and the third insulating layer PAS3 may be made of a same material. As another example, some of them may be made of a same material while the other(s) may be made of different material(s), or they may be made of different materials.

The second connection electrode CNE2 is exposed during a subsequent process, on the third insulating layer PAS3, and a strong instantaneous voltage may be applied to the second connection electrode CNE2 if static electricity is generated. According to this embodiment, by increasing the area of the second connection electrode CNE2, it is possible to prevent the second connection electrode CNE2 and the light-emitting elements ED connected to the second connection electrode CNE2 from being damaged by static electricity.

According to the embodiment of the disclosure, the second connection electrode CNE2 may be extended in the second direction DR2 to overlap the first connection electrode CNE1. The second connection electrode CNE2 may entirely cover a portion of the second insulating layer PAS2 that overlaps the light-emitting elements ED. The second connection electrode CNE2 may entirely cover the light-emitting elements ED and may overlap the entirety of the light-emitting elements ED. According to the embodiment of the disclosure, the second connection electrode CNE2 may contact and overlap the second ends of the light-emitting elements ED, and may overlap the first ends of the light-emitting elements ED. The first connection electrode CNE1 may contact and overlap the first ends of the light-emitting elements ED, and may overlap a portion of the light-emitting elements ED.

The second connection electrode CNE2 may overlap the first electrode RME1 as well as the second electrode RME2. The second connection electrode CNE2 may overlap the space between the first electrode RME1 and the second electrode RME2 spaced apart from each other in the second direction DR2. For example, the second connection electrode CNE2 may be extended continuously from the second electrode RME2 to a portion of the first electrode RME1.

According to the embodiment of the disclosure, the width W2 of the second connection electrode CNE2 in the second direction DR2 may be greater than the width W1 of the first connection electrode CNE1 in the second direction DR2. According to an embodiment of the disclosure, the width W2 of the second connection electrode CNE2 may be about 110% to about 200% of the width W1 of the first connection electrode CNE1. It should be understood, however, that the disclosure is not limited thereto. The width W2 of the second connection electrode CNE2 may exceed about 200% of the width W1 of the first connection electrode CNE1.

As the width W2 of the second connection electrode CNE2 in the second direction DR2 is increased, it may overlap the first connection electrode CNE1 disposed in the second direction DR2. Accordingly, the second connection electrode CNE2 may overlap the first connection electrode CNE1 in the third direction DR3. According to an embodiment of the disclosure, the second connection electrode CNE2 may overlap a portion of the first connection electrode CNE1. It should be understood, however, that the disclosure is not limited thereto. The second connection electrode CNE2 may overlap the entire first connection electrode CNE1.

The area of the second connection electrode CNE2 may be larger than the area of the first connection electrode CNE1. As mentioned earlier, a strong voltage due to static electricity may be applied to the second connection electrode CNE2, and a sufficient current path can be obtained as the area of the second connection electrode CNE2 is increased. According to an embodiment of the disclosure, the area of the second connection electrode CNE2 may range from about 110% to about 200% of the area of the first connection electrode CNE1. It should be understood, however, that the disclosure is not limited thereto. The area of the second connection electrode CNE2 may exceed about 200% of the area of the first connection electrode CNE1.

As described above, in the display device 10 according to an embodiment, by forming the second connection electrode CNE2 so that it overlaps the first connection electrode CNE1, an anti-overcurrent structure can be achieved, which allows static electricity to escape through the second connection electrode CNE2 having a large area. Accordingly, it is possible to prevent damage to the second connection electrode CNE2 or the light-emitting elements ED, thereby addressing dark spot defects.

Figure 9:
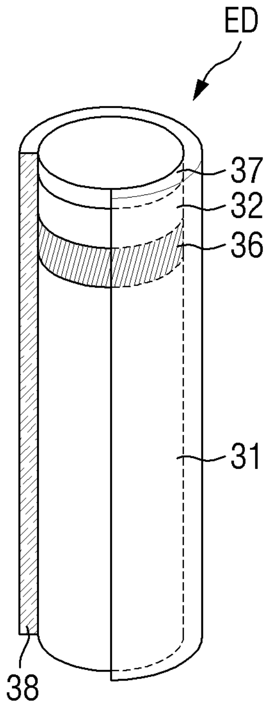
FIG. 9 is a schematic view showing a light-emitting element according to an embodiment of the disclosure.

FIG. 9 is a schematic view illustrating a light-emitting element according to an embodiment of the disclosure.

Referring to FIG. 9, a light-emitting element ED may be a light-emitting diode. Specifically, the light-emitting element ED may have a size from nanometers to micrometers and may be an inorganic light-emitting diode made of an inorganic material. The light-emitting element ED may be aligned between two electrodes facing each other as polarities are created by forming an electric field in a particular direction between the two electrodes.

The light-emitting element ED according to an embodiment may have a shape extended in a direction. The light-emitting element ED may have a shape of a cylinder, a rod, a wire, a tube, etc. It is to be understood that the shape of the light-emitting element ED is not limited thereto. The light-emitting element ED may have a variety of shapes including a polygonal column shape such as a cube, a cuboid and a hexagonal column, or a shape that is extended in a direction with partially inclined outer surfaces.

The light-emitting element ED may include semiconductor layers doped with a dopant of a conductive type (e.g., p-type or n-type). The semiconductor layers may emit light of a certain wavelength band by receiving an electric signal applied from an external power source. The light-emitting diode ED may include a first semiconductor layer 31, a second semiconductor layer 32, an emissive layer 36, an electrode layer 37, and an insulating film 38.

The first semiconductor layer 31 may be an n-type semiconductor. The first semiconductor layer 31 may include a semiconductor material having the following chemical formula: $Al_xGa_yIn_{1-x-y}N$ ($0 \le x \le 1$, $0 \le y \le 1$, $0 \le x+y \le 1$). For example, the first semiconductor layer 31 may be one or more of AlGaInN, GaN, AlGaN, InGaN, AlN and InN doped with n-type dopant. The n-type dopant with which the first semiconductor layer 31 is doped may be Si, Ge, Sn, etc.

The second semiconductor layer 32 is disposed above the first semiconductor layer 31 with the emissive layer 36 therebetween. The second semiconductor layer 32 may be a p-type semiconductor, and may include a semiconductor material having the following chemical formula: $Al_xGa_yIn_{1-x-y}N$ ($0 \le x \le 1$, $0 \le y \le 1$, $0 \le x+y \le 1$). For example, the second semiconductor layer 32 may be one or more of AlGaInN, GaN, AlGaN, InGaN, AlN and InN doped with p-type dopant. The p-type dopant with which the second semiconductor layer 32 is doped may be at least one of Mg, Zn, Ca, Ba, etc.

Although each of the first semiconductor layer 31 and the second semiconductor layer 32 is implemented as a signal layer in the drawings, the disclosure is not limited thereto. Depending on the material of the emissive layer 36, the first semiconductor layer 31 and the second semiconductor layer 32 may further include a larger number of layers, e.g., a clad layer or a tensile strain barrier reducing (TSBR) layer. For example, the light-emitting elements ED may further include another semiconductor layer disposed between the first semiconductor layer 31 and the emissive layer 36 or between the second semiconductor layer 32 and the emissive layer 36. The semiconductor layer disposed between the first semiconductor layer 31 and the emissive layer 36 may be one or more of AlGaInN, GaN, AlGaN, InGaN, AN, and InN doped with an n-type dopant. The semiconductor layer disposed between the second semiconductor layer 32 and the emissive layer 36 may be one or more of AlGaInN, GaN, AlGaN, InGaN, AN, and InN doped with a p-type dopant.

The emissive layer 36 is disposed between the first semiconductor layer 31 and the second semiconductor layer 32. The emissive layer 36 may include a material having a single or multiple quantum well structure. In case that the emissive layer 36 includes a material having the multiple quantum well structure, the structure may include quantum layers and well layers alternately stacked on one another. The emissive layer 36 may emit light as electron-hole pairs are combined therein in response to an electrical signal applied through the first semiconductor layer 31 and the second semiconductor layer 32. The emissive layer 36 may include a material such as AlGaN, AlGaInN, and InGaN. In particular, in case that the emissive layer 36 has a multi-quantum well structure in which quantum layers and well layers are alternately stacked on one another, the quantum layers may include AlGaN or AlGaInN, and the well layers may include a material such as GaN and AlGaN.

The emissive layer 36 may have a structure in which a semiconductor material having large band gap energy and a semiconductor material having small band gap energy are alternately stacked on one another, and may include different Group III to V semiconductor materials depending on the wavelength range of the emitted light. Accordingly, the light emitted from the emissive layer 36 is not limited to the light of the blue wavelength band. The emissive layer 36 may emit light of a red or green wavelength band in some embodiments.

The electrode layer 37 may be an ohmic connection electrode. It is, however, to be understood that the disclosure is not limited thereto. The electrode layer 37 may be a Schottky connection electrode. The light-emitting diode ED may include at least one electrode layer 37. The light-emitting diode ED may include one or more electrode layers 37. It is, however, to be understood that the disclosure is not limited thereto. The electrode layer 37 may be eliminated.

The electrode layer 37 can reduce the resistance between the light-emitting element ED and the electrodes or the connection electrodes in case that the light-emitting element ED is electrically connected to the electrodes or the connection electrodes in the display device 10. The electrode layer 37 may include a metal having conductivity. For example, the electrode layer 37 may include at least one of aluminum (Al), titanium (Ti), indium (In), gold (Au), silver (Ag), ITO, IZO and ITZO.

The insulating film 38 is disposed to surround the outer surfaces of the semiconductor layers and electrode layers described above. For example, the insulating film 38 may be disposed to surround at least the outer surface of the emissive layer 36, with ends of the light-emitting element ED in the longitudinal direction exposed. A portion of the upper surface of the insulating film 38 may be rounded in a cross-sectional view, which is adjacent to at least one of the ends of the light-emitting diode ED.

The insulating film 38 may include materials having insulating properties, for example, at least one of: silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). Although the insulating film 38 is formed as a single layer in the drawings, the disclosure is not limited thereto. In some embodiments, the insulating film 38 may be made up of a multilayer structure in which multiple layers are stacked on one another.

The insulating film 38 can protect the semiconductor layers and the electrode layer of the light-emitting elements ED. The insulating film 30 can prevent an electrical short circuit that may occur in the emissive layer 36 if it directly contacts an electrode through which an electric signal is transmitted to the light-emitting diode ED. The insulating film 38 can prevent a decrease in luminous efficiency.

The outer surface of the insulating film 38 may be subjected to surface treatment. The light-emitting elements ED may be dispersed in an ink, and the ink may be sprayed onto the electrode. A surface treatment may be applied to the insulating film 38 so that it becomes hydrophobic or hydrophilic in order to keep the light-emitting elements ED dispersed in the ink without being aggregated with one another.

Hereinafter, display devices according to other embodiments will be described with reference to other drawings.

Figure 10:
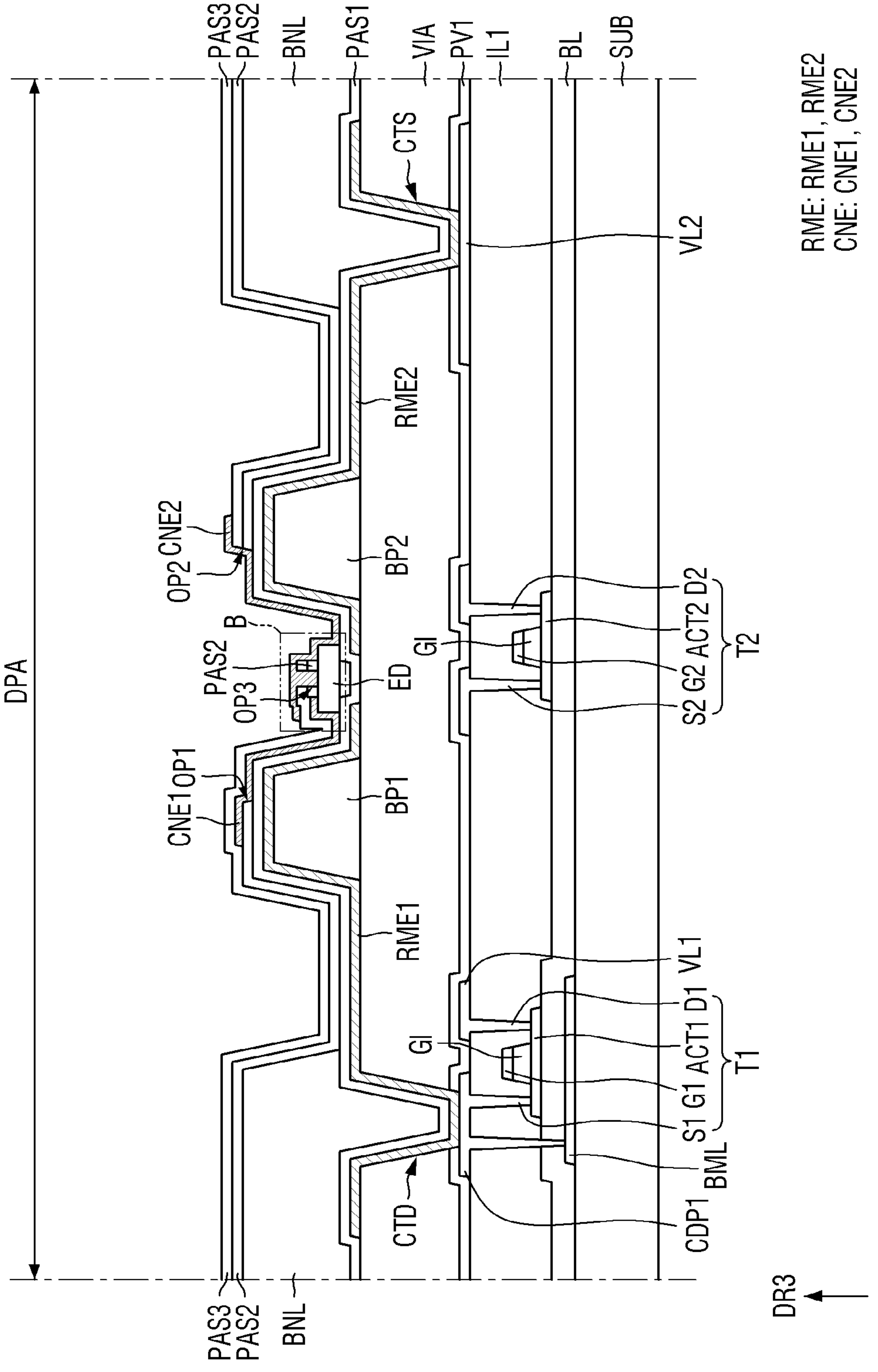
FIG. 10 is a schematic cross-sectional view showing a display device according to another embodiment of the disclosure.
Figure 11:
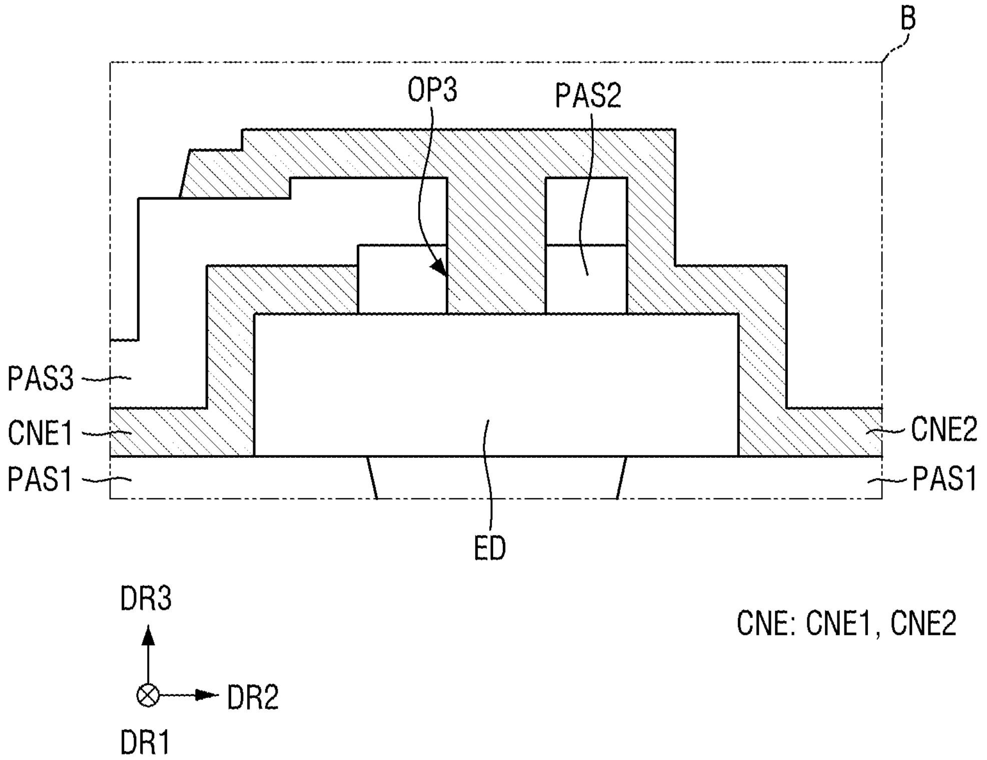
FIG. 11 is a schematic enlarged cross-sectional view of area B of FIG. 10.
Figure 12:
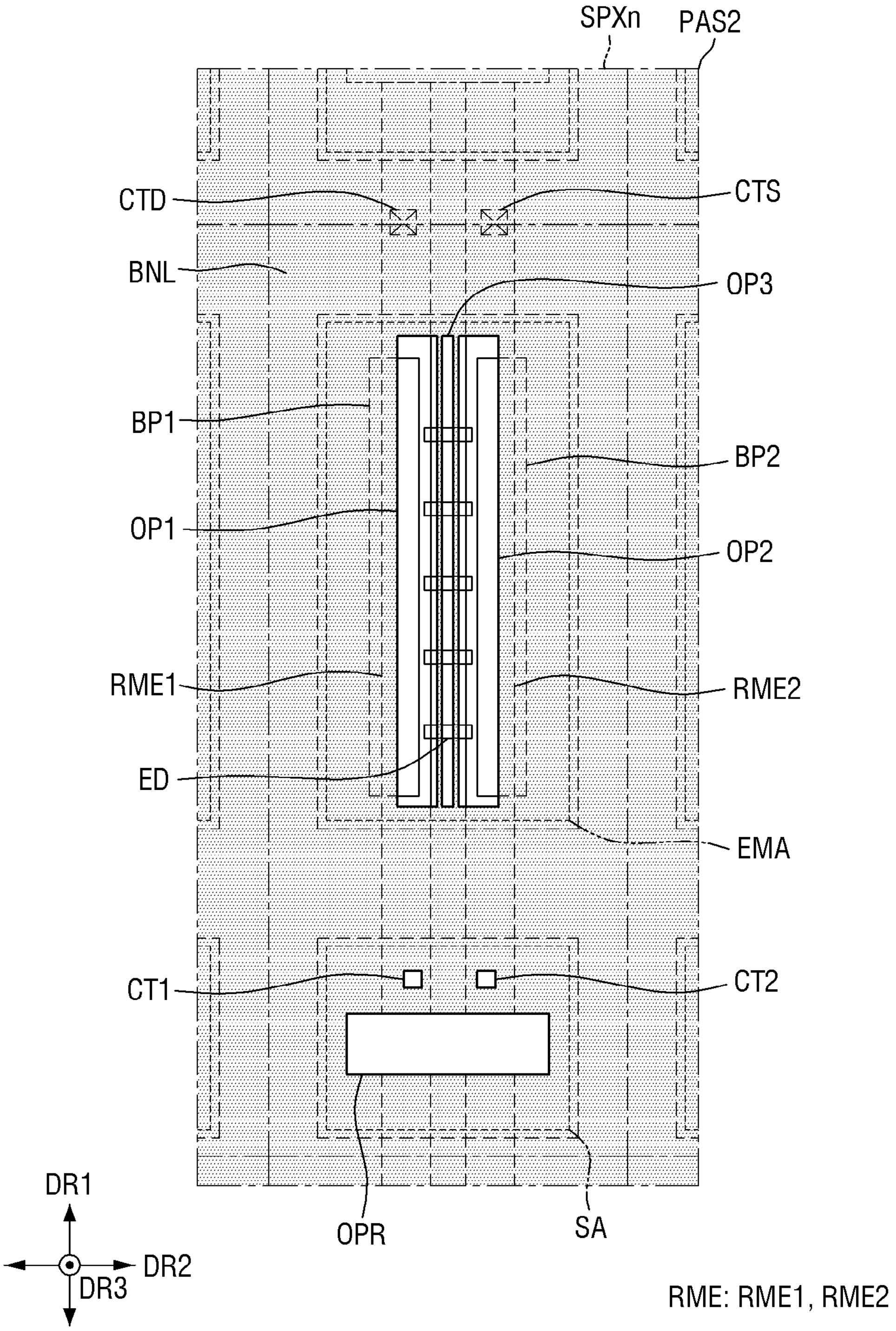
FIG. 12 is a schematic plan view showing a second insulating layer of a display device according to the embodiment.

FIG. 10 is a schematic cross-sectional view illustrating a display device according to another embodiment of the disclosure. FIG. 11 is a schematic enlarged cross-sectional view of area B of FIG. 10. FIG. 12 is a schematic plan view illustrating a second insulating layer of a display device according to the embodiment.

The embodiment shown in FIGS. 10 to 12 is substantially identical to the above-described embodiment shown in FIGS. 4 to 8 except that a third opening OP3 is further formed in a second insulating layer PAS2 overlapping light-emitting elements ED, and the third opening OP3 is filled with a second connection electrode CNE2, and, therefore, the redundant descriptions will be omitted.

According to the embodiment of the disclosure, the second insulating layer PAS2 may include openings OP1, OP2, OP3 and OPR and contacts CT1 and CT2. The second insulating layer PAS2 may include separation openings OPR each formed to correspond to the separation region ROP of the subsidiary area SA, first and second openings OP1 and OP2 partially disposed to correspond to the electrodes RME to expose the first and second ends of the light-emitting elements ED in the emission area EMA, and openings OP3 each formed between the first opening OP1 and the second opening OP2. The second insulating layer PAS2 may include the contacts CT1 and CT2 formed where the connection electrodes CNE and the electrodes RME are connected. The second insulating layer PAS2 may be disposed entirely on the first insulating layer PAS1, and may partially expose the underlying layers where the openings are formed.

As the openings formed in the second insulating layer PAS2, in the separation opening OPR formed to correspond to the separation region ROP of the subsidiary area SA, a process of separating the electrodes RME disposed thereunder from each other may be carried out. Similar to the first insulating layer PAS1, the second insulating layer PAS2 may also include the separation opening OPR exposing the upper surface of the via layer VIA in the separation region ROP in which the process of separating the electrodes RME is carried out.

The second insulating layer PAS2 may include a first opening OP1 partially overlapping the first electrode RME1 and a second opening OP2 partially overlapping the second electrode RME2. The first opening OP1 and the second opening OP2 may be formed the emission area EMA and may expose the ends of the light-emitting elements ED. The first opening OP1 may not expose or cover the first ends of the light-emitting elements devices ED disposed on the first electrode RME1, and the second opening OP2 may not expose or cover the second ends of the light-emitting elements ED disposed on the second electrode RME2.

The first opening OP1 may be formed to overlap a side of the first electrode RME1 that faces the second electrode RME2, and may have a shape extended in the first direction DR1. The first opening OP1 may expose the first ends of the light-emitting elements ED. The second opening OP2 may be formed to overlap a side of the second electrode RME2 that faces the first electrode RME1, and may have a shape extended in the first direction DR1. The second opening OP2 may expose the second ends of the light-emitting elements ED. As will be described below, the second opening OP2 may also penetrate the third insulating layer PAS3 to be described below. The connection electrodes CNE may contact the ends of the light-emitting elements ED exposed through the first openings OP1 and second openings OP2.

A first opening OP1 and a second opening OP2 may be formed in a sub-pixel SPXn. It is, however, to be understood that the disclosure is not limited thereto. In some embodiments, more than one first openings OP1 and second openings OP2 may be formed in a sub-pixel SPXn.

The first opening OP1 and the second opening OP2 may be located in the emission area EMA in which the light-emitting elements ED are disposed, and may partially overlap the light-emitting elements ED. The first opening OP1 and the second opening OP2 may expose portions of the light-emitting elements ED so that the connection electrodes CNE disposed on the second insulating layer PAS2 contact the light-emitting elements ED. Since the light-emitting elements ED are disposed on the electrodes RME in the emission area EMA, the first opening OP1 and the second opening OP2 may overlap the electrodes RME and the light-emitting elements ED.

According to an embodiment of the disclosure, the second insulating layer PAS2 may include a third opening OP3 located between the first opening OP1 and the second opening OP2. Unlike the openings OP1 and OP2 that partially overlap the electrodes RME, the third opening OP3 may not overlap the electrodes RME. The third opening OP3 may have a shape extended in the first direction DR1 and may overlap the light-emitting elements ED. The third opening OP3 may be partially located where the light-emitting elements ED are arranged in the first direction DR1. The third opening OP3 may expose a portion of the upper surface of each of the light-emitting elements ED, and the second connection electrode CNE2 may be disposed directly on the exposed upper surface of each of the light-emitting elements ED. The third opening OP3 may penetrate through the third insulating layer PAS3 to expose a portion of the upper surfaces of the light-emitting elements ED.

The area of the third opening OP3 may be smaller than the area of the first opening OP1 and smaller than the area of the second opening OP2. The width of the third opening OP3 in the second direction DR2 may be smaller than the width of the first opening OP1 in the second direction DR2, and the width of the second opening OP2 in the second direction DR2.

The second connection electrode CNE2 may be disposed in the third opening OP3 of the second insulating layer PAS2. The third opening OP3 may be filled with the second connection electrode CNE2. The second connection electrode CNE2 may directly contact a portion of the upper surface of each of the light-emitting elements ED exposed by the third opening OP3. The second connection electrode CNE2 may directly contact a side of the second insulating layer PAS2 and a side of the third insulating layer PAS3. The third opening OP3 may be filled with the second connection electrode CNE2, and the second connection electrode CNE2 may be extended in the second direction DR2 so that it overlaps the first connection electrode CNE1 on the third insulating layer PAS3. The first connection electrode CNE1 may be spaced apart from the third opening OP3 and may not overlap the third opening OP3 in a plan view.

According to the embodiment of the disclosure, as the third opening OP3 is filled with the second connection electrode CNE2, the volume of the second connection electrode CNE2 can be increased. As the volume of the second connection electrode CNE2 is increased by the size (or volume) of the third opening OP3, a sufficient current path can be obtained. Accordingly, it is possible to prevent damage to the second connection electrode CNE2 or the light-emitting elements ED, thereby addressing dark spot defects of the display device 10.

Figure 13:
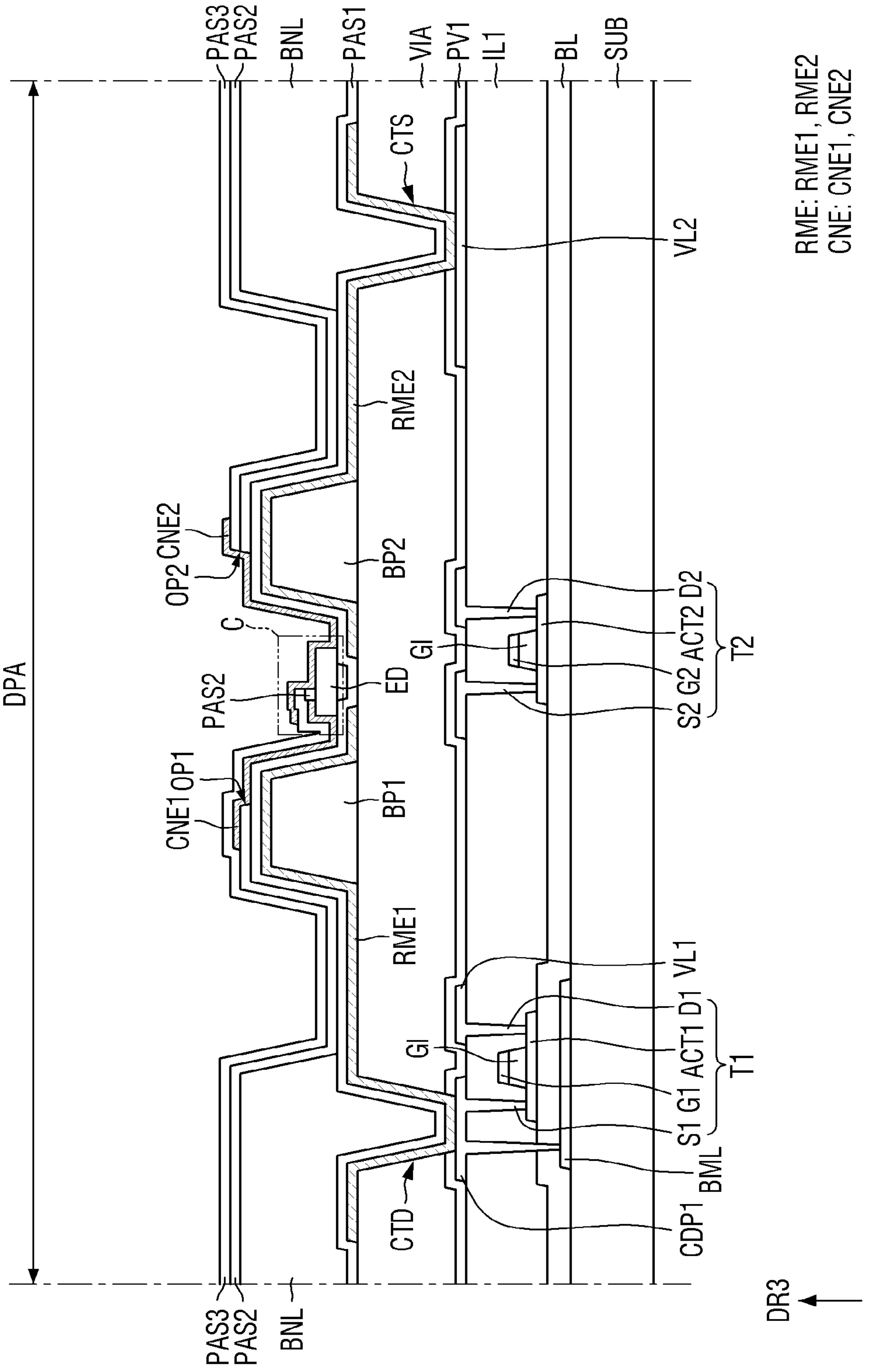
FIG. 13 is a schematic cross-sectional view showing a display device according to yet another embodiment of the disclosure.
Figure 14:
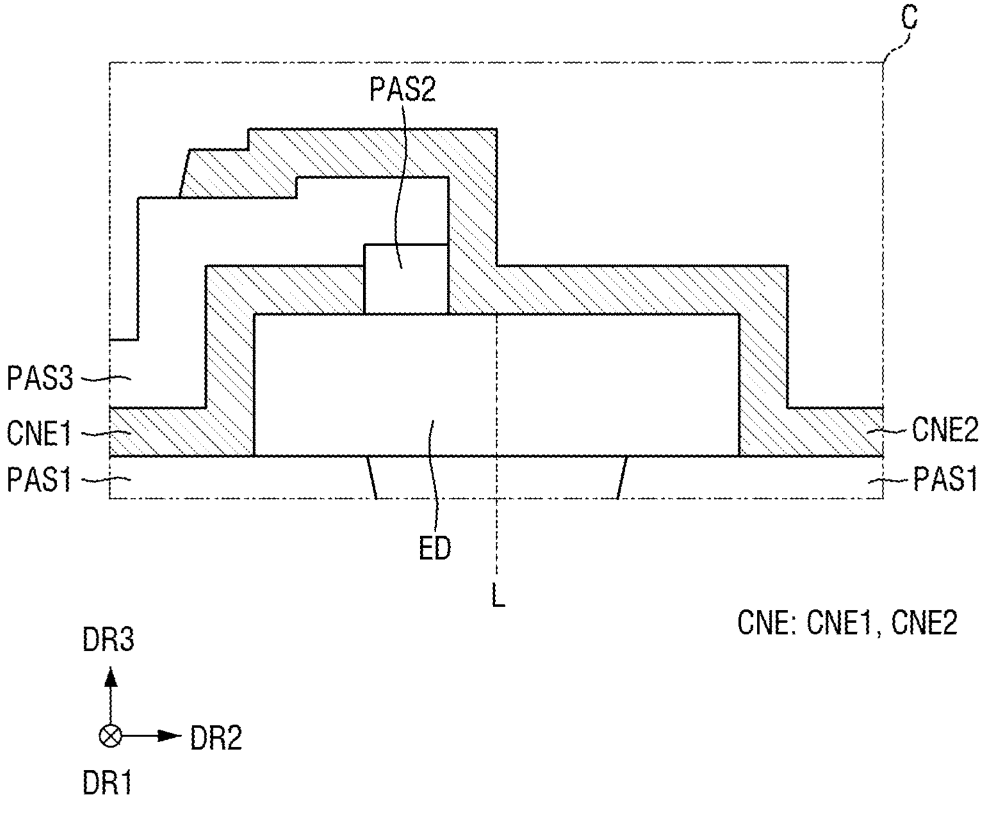
FIG. 14 is a schematic enlarged cross-sectional view of area C of FIG. 13.
Figure 15:
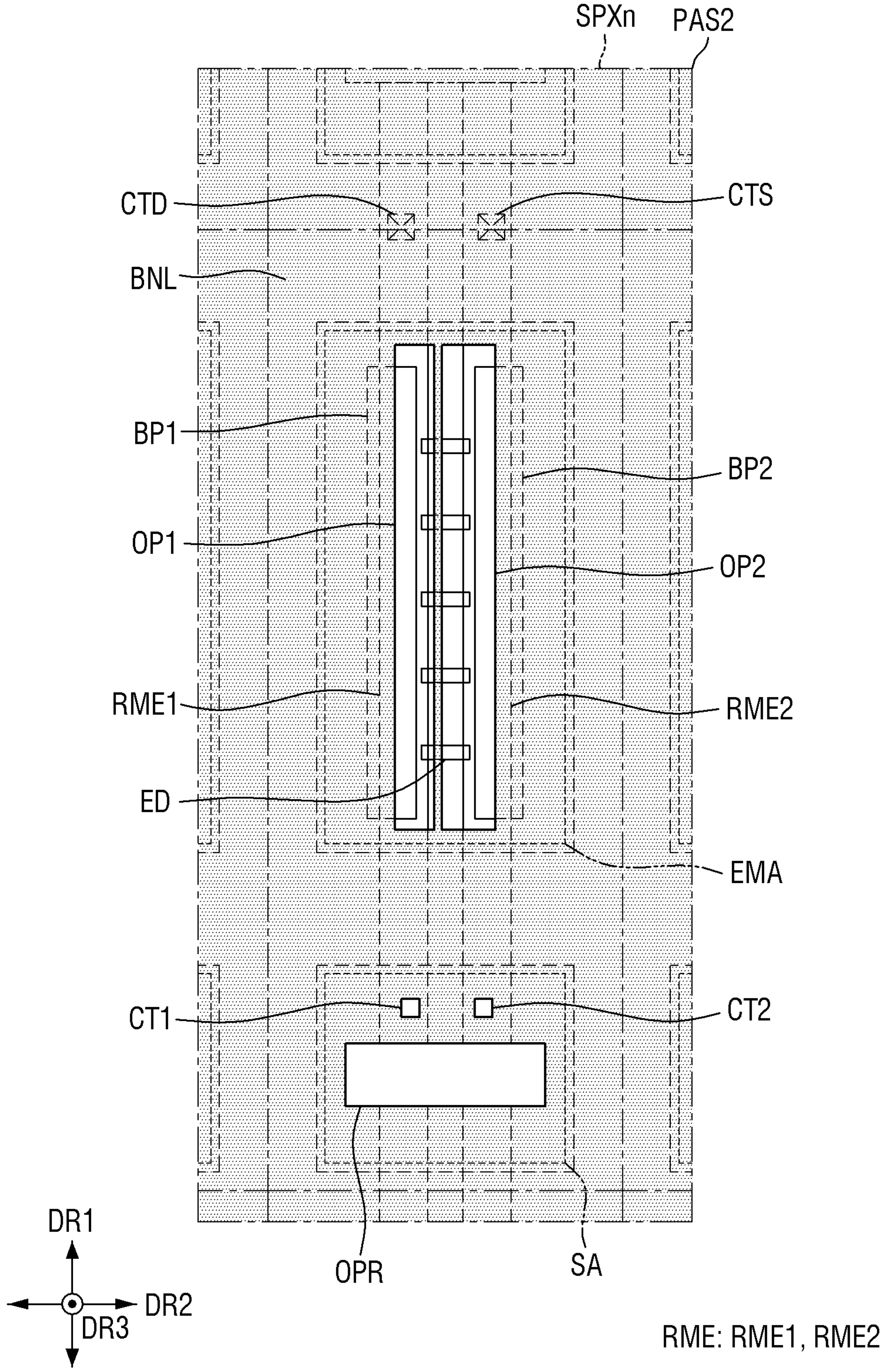
FIG. 15 is a schematic plan view showing a second insulating layer of a display device according to the embodiment.

FIG. 13 is a schematic cross-sectional view illustrating a display device according to yet another embodiment of the disclosure. FIG. 14 is a schematic enlarged, cross-sectional view of area C of FIG. 13. FIG. 15 is a schematic plan view illustrating a second insulating layer of a display device according to the embodiment.

The embodiment shown in FIGS. 13 to 15 is substantially identical to the above-described embodiment shown in FIGS. 4 to 8 except that an area of a second opening OP2 of a second insulating layer PAS2 is greater than an area of a first opening OP1 over light-emitting elements ED, and, therefore, the redundant descriptions will be omitted.

According to the embodiment of the disclosure, the second insulating layer PAS2 may include openings OP1 and OP2 and contacts CT1 and CT2. The second insulating layer PAS2 may include a separation opening OPR formed to correspond to the separation region ROP of the subsidiary area SA, and first and second openings OP1 and OP2 partially disposed to correspond to the electrodes RME to expose the first and second ends of the light-emitting elements ED in the emission area EMA. The second insulating layer PAS2 may include the contacts CT1 and CT2 formed where the connection electrodes CNE and the electrodes RME are connected. The openings OP1 and OP2, the contacts CT1 and CT2 and the separation opening OPR of the second insulating layer PAS2 are substantially identical to those of the above-described embodiment of FIGS. 10 to 12, and, therefore, the redundant descriptions will be omitted According to an embodiment of the disclosure, in the second insulating layer PAS2, the area of the first opening OP1 may be different from the area of the second opening OP2. For example, the area of the second opening OP2 may be larger than the area of the first opening OP1 in the second insulating layer PAS2. According to the embodiment of the disclosure, the width of the second opening OP2 of the second insulating layer PAS2 in the second direction DR2 may be greater than the width of the first opening OP1 in the second direction DR2.

The second insulating layer PAS2 disposed on the light-emitting elements ED may be disposed closer to a side of the light-emitting elements ED. For example, the second insulating layer PAS2 may not overlap an imaginary line L equally dividing the light-emitting elements ED in the longitudinal direction, and may be disposed closer to the first connection electrode CNE1 or the first bank pattern BP1.

The area of a portion of each of the light-emitting elements ED exposed by the second opening OP2 of the second insulating layer PAS2 may be larger than the area of a portion of each of the light-emitting elements ED exposed by the first opening OP1. The contact area between the second connection electrode CNE2 and the light-emitting elements ED in the second opening OP2 may be greater than the contact area between the first connection electrode CNE1 and the light-emitting elements ED in the first opening OP1. The width of the second connection electrode CNE2 in the second direction DR2 may be greater than the width of the first connection electrode CNE1 in the second direction DR2. Accordingly, as the area of the second connection electrode CNE2 is increased, it is possible to prevent damage to the second connection electrode CNE2 and the light-emitting elements ED due to static electricity.

Figure 16:
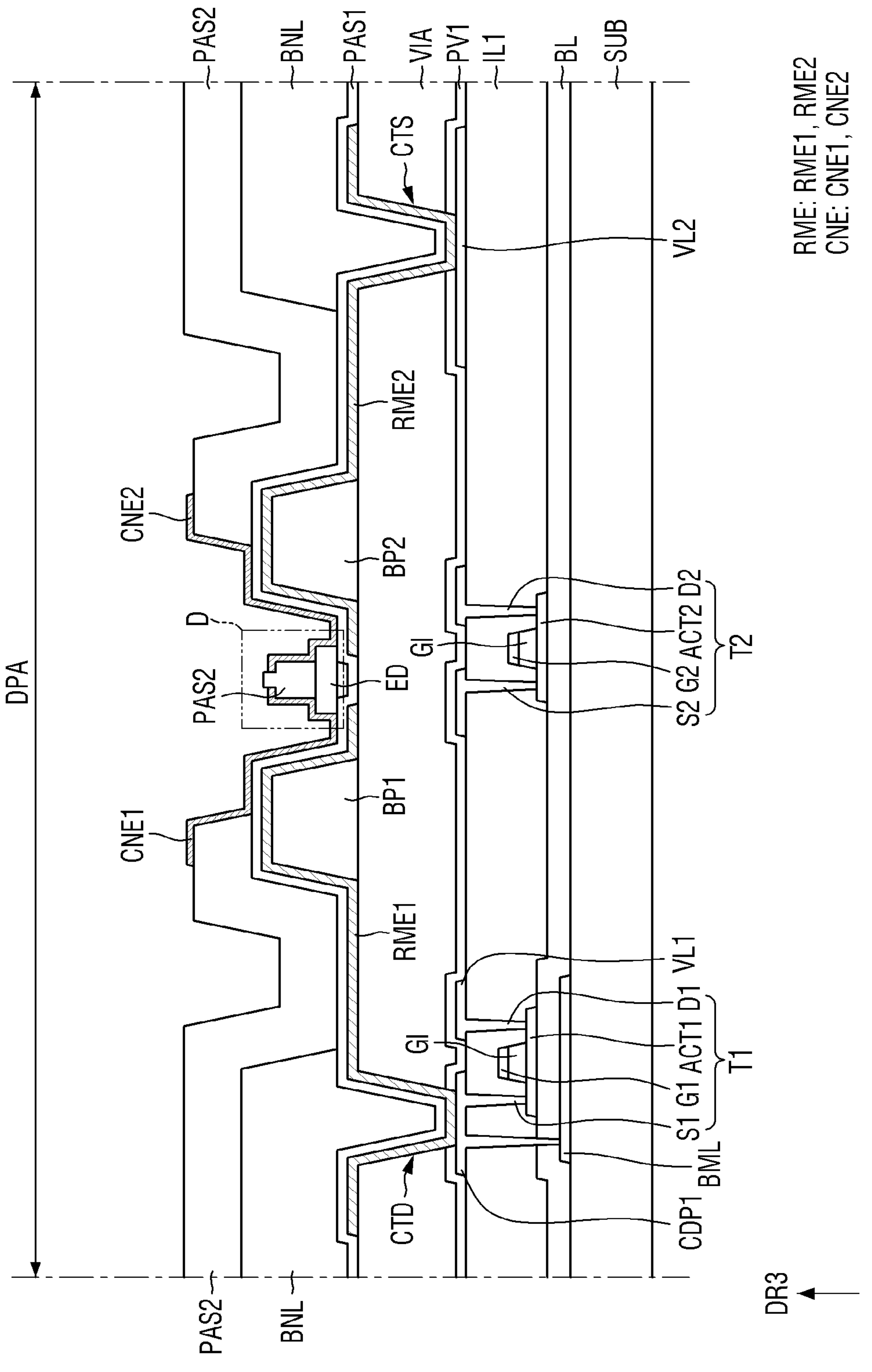
FIG. 16 is a schematic cross-sectional view showing a display device according to yet another embodiment of the disclosure.
Figure 17:
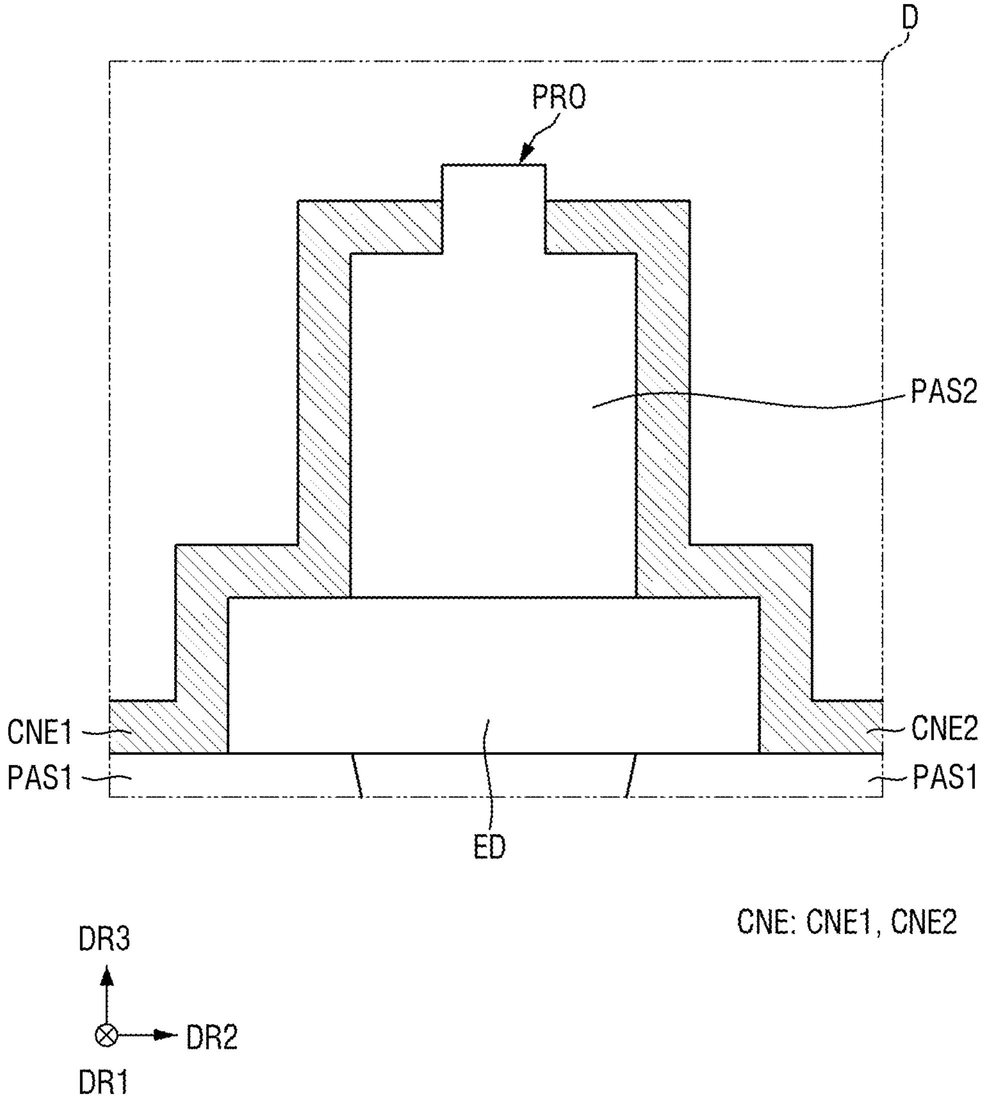
FIG. 17 is a schematic enlarged cross-sectional view of area D of FIG. 16.

FIG. 16 is a schematic cross-sectional view illustrating a display device according to yet another embodiment of the disclosure. FIG. 17 is a schematic enlarged cross-sectional view of area D of FIG. 16.

The embodiment shown in FIGS. 16 and 17 is substantially identical to the above-described embodiments shown in FIGS. 4 to 15 except that a second insulating layer PAS2 includes an insulating organic material, and a third insulating layer PAS3 is eliminated, and, therefore, the redundant descriptions will be omitted.

According to an embodiment of the disclosure, the second insulating layer PAS2 may include an insulating organic material such as polyimide. The second insulating layer PAS2 may have a large thickness by utilizing characteristics of such an organic material. For example, the thickness of the second insulating layer PAS2 may be greater than the thickness of the first insulating layer PAS1. The thickness of the second insulating layer PAS2 may be greater than the diameter of the light-emitting elements ED. The height of the upper surface of the second insulating layer PAS2 where it overlaps the light-emitting elements ED may be equal to the height of the upper surface of the bank patterns BP1 and BP2 or the bank layer BNL. It should be understood, however, that the disclosure is not limited thereto. The height of the upper surface of the second insulating layer PAS2 where it overlaps the light-emitting elements ED may be less than the height of the upper surface of the bank patterns BP1 and BP2 or the bank layer BNL.

A protrusion PRO may be formed on the upper surface of the second insulating layer PAS2. The protrusion PRO may be integral with the second insulating layer PAS2 and may be extended in the first direction DR1 on the second insulating layer PAS2. The protrusion PRO of the second insulating layer PAS2 may separate the first connection electrode CNE1 from the second connection electrode CNE2. For example, the first connection electrode CNE1 and the second connection electrode CNE2 may be spaced apart from each other with the protrusion PRO therebetween.

The first connection electrode CNE1 may be disposed on a portion of the second insulating layer PAS2, and the second connection electrode CNE2 may be disposed on another portion of the second insulating layer PAS2. For example, the first connection electrode CNE1 may be disposed on the side of the protrusion PRO of the second insulating layer PAS2 that is adjacent to the first bank pattern BP1, while the second connection electrode CNE2 may be disposed on the side of the protrusion PRO of the second insulating layer PAS2 that is adjacent to the second bank pattern BP2. The first connection electrode CNE1 may be extended along a side surface of the second insulating layer PAS2 to the upper surface of the second insulating layer PAS2 and a side surface of the protrusion PRO. The second connection electrode CNE2 may be extended along another side surface of the second insulating layer PAS2 to the upper surface of the second insulating layer PAS2 and another side surface of the protrusion PRO. Unlike the above-described embodiments, the first connection electrode CNE1 and the second connection electrode CNE2 may have a same width, size, and area.

According to the embodiment of the disclosure, the first connection electrode CNE1 and the second connection electrode CNE2 may be extended to the side and upper surfaces of the second insulating layer PAS2 having a larger thickness, so that the area of each of the first connection electrode CNE1 and the second connection electrode CNE2 can be increased.

Accordingly, even if static electricity is generated during a subsequent process in the first connection electrode CNE1 and/or the second connection electrode CNE2, a sufficient current path can be formed, so that it is possible to prevent damage to the connection electrodes CNE1 and CNE2 and the light-emitting elements ED.

Figure 18:
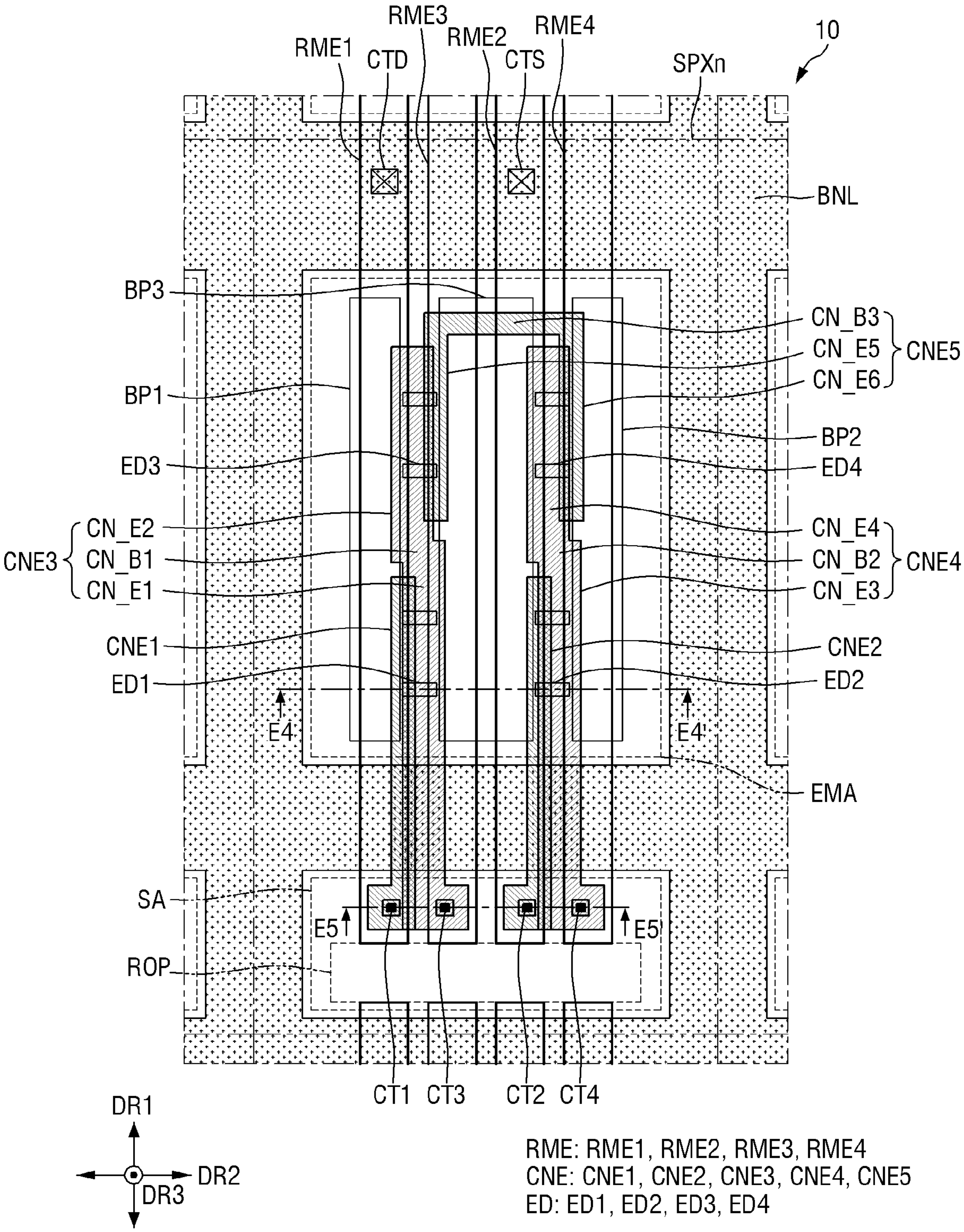
FIG. 18 is a schematic plan view showing a sub-pixel of a display device according to yet another embodiment of the disclosure.
Figure 19:
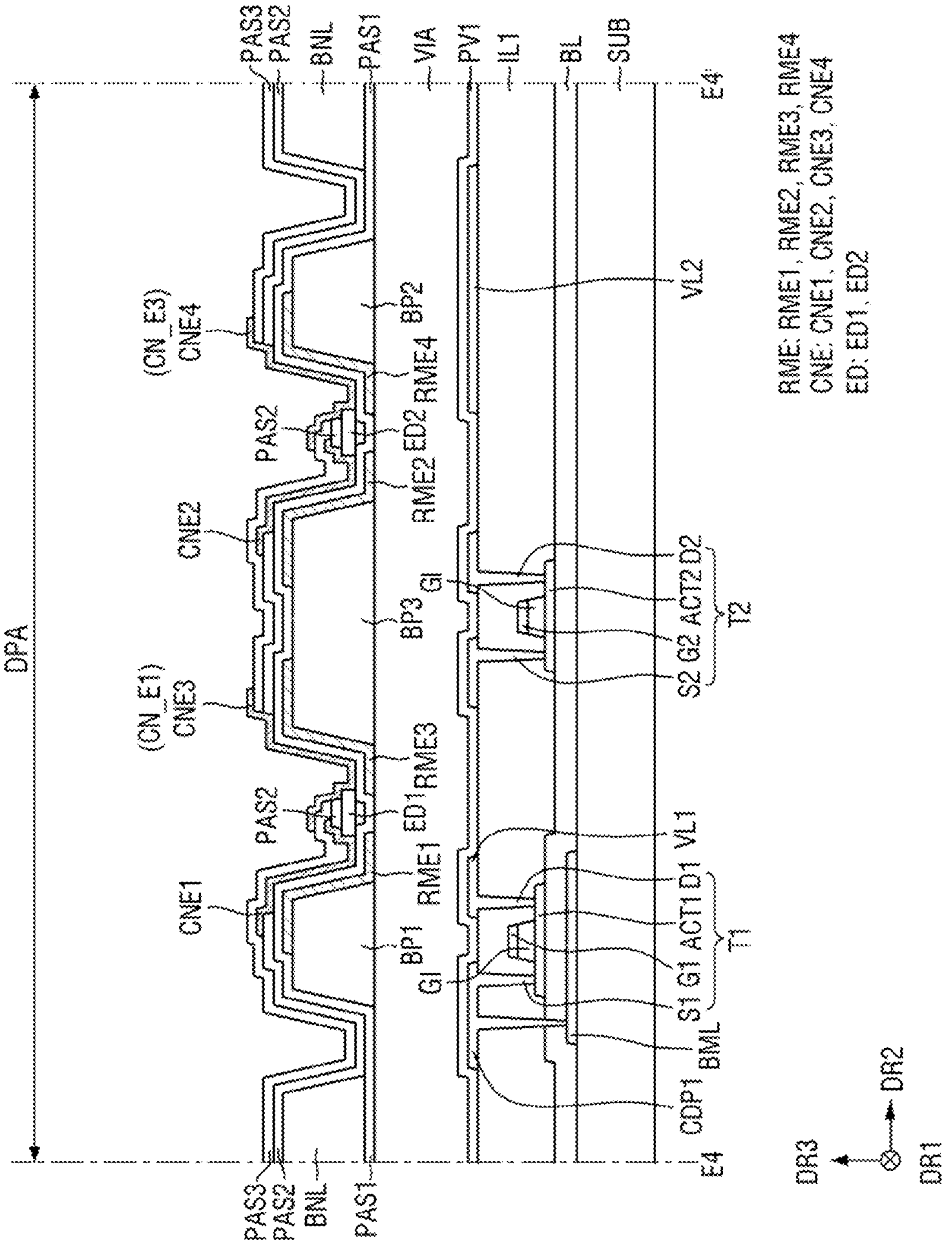
FIG. 19 is a schematic cross-sectional view taken along line E4-E4' of FIG. 18.
Figure 20:
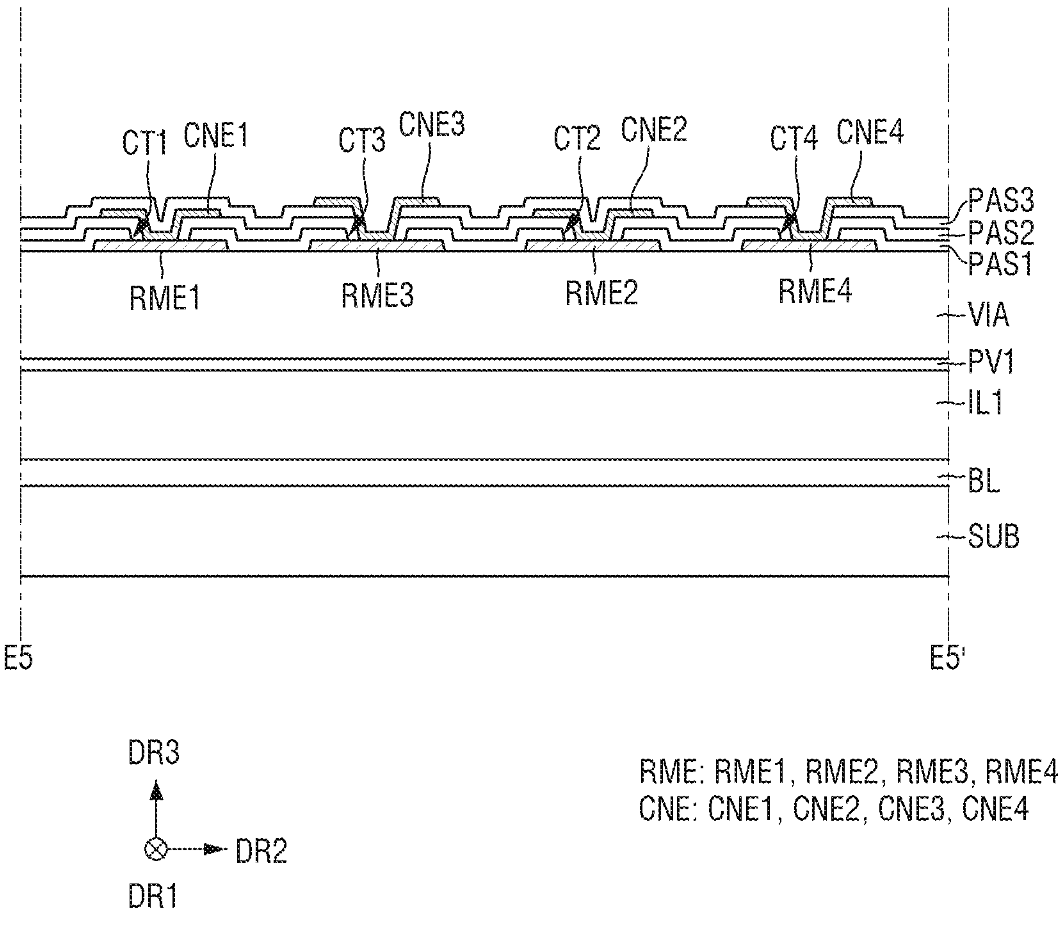
FIG. 20 is a schematic cross-sectional view taken along line E5-E5' of FIG. 18.
Figure 21:
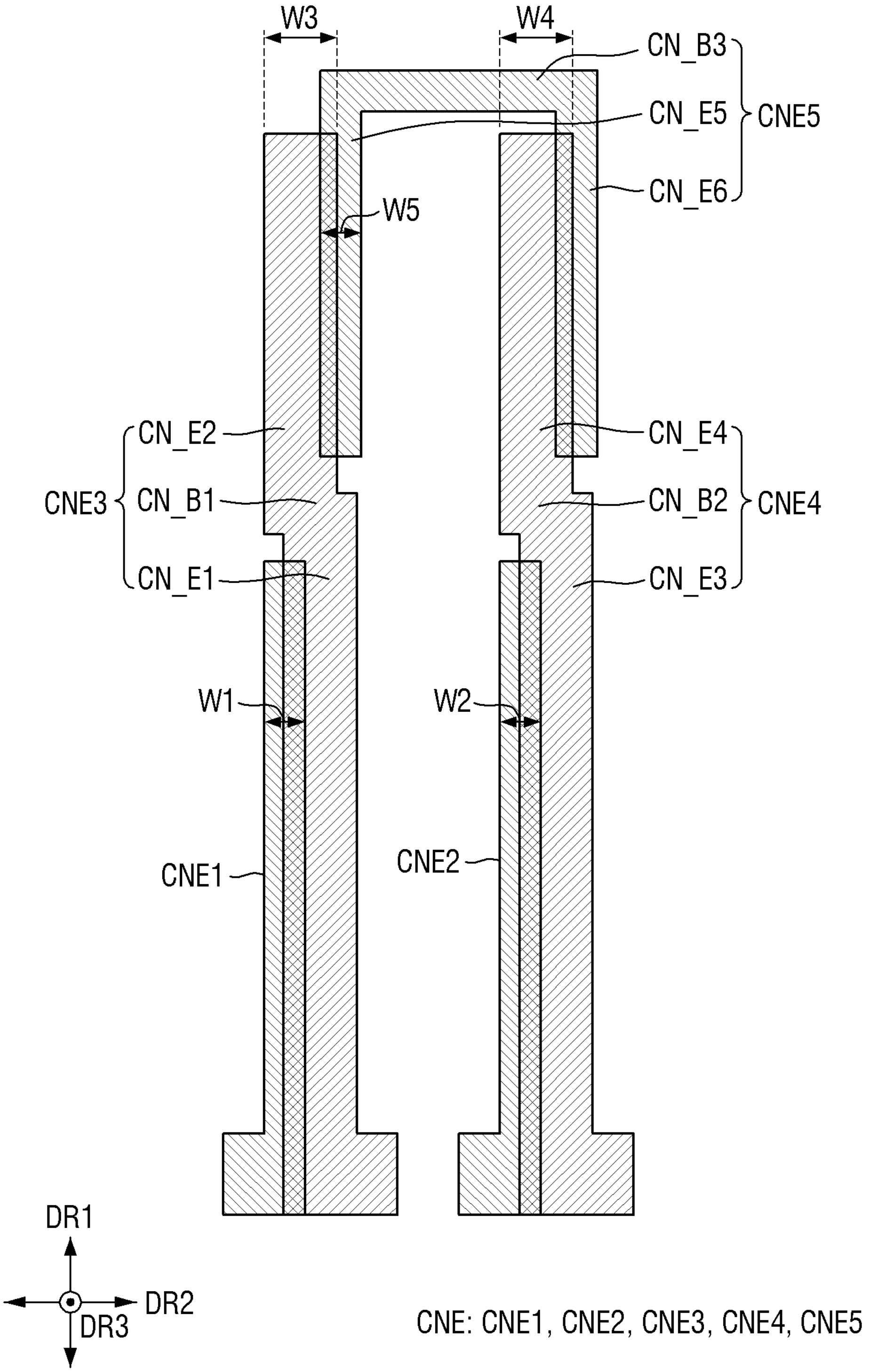
FIG. 21 is a schematic plan view schematically showing connection electrodes of a display device according to still another embodiment of the disclosure.

FIG. 18 is a schematic plan view illustrating a sub-pixel of a display device according to yet another embodiment of the disclosure. FIG. 19 is a schematic cross-sectional view taken along line E4-E4' of FIG. 18. FIG. 20 is a schematic cross-sectional view taken along line E5-E5' of FIG. 18. FIG. 21 is a schematic plan view schematically illustrating connection electrodes of a display device according to still another embodiment of the disclosure.

FIG. 18 illustrates a layout of electrodes RME (RME1, RME2, RME3 and RME4), bank patterns BP1, BP2 and BP3, a bank layer BNL, light-emitting elements ED, and connection electrodes CNE (CNE1, CNE2, CNE3, CNE4 and CNE5) disposed in a sub-pixel SPXn of a display device 10 in a plan view.

Referring to FIG. 18, according to the embodiment of the disclosure, the display device 10 may include a larger number of electrodes RME (RME1, RME2, RME3 and RME4), bank patterns BP1, BP2 and BP3, light-emitting elements ED (ED1, ED2, ED3 and ED4), and connection electrodes CNE (CNE1, CNE2, CNE3, CNE4 and CNE5). The display device 10 according to this embodiment is different from the above-described embodiment of FIG. 4 in that each of the sub-pixels SPXn includes larger numbers of electrodes and light-emitting elements. In the following description, descriptions will focus on the difference, and the redundant description will be omitted.

Referring to FIGS. 18 to 21, the bank patterns BP1, BP2 and BP3 may further include a third bank pattern BP3 disposed between the first bank pattern BP1 and the second bank pattern BP2. The first bank pattern BP1 may be disposed on the left side of the center of the emission area EMA, the second bank pattern BP2 may be disposed on the right side of the center of the emission area EMA, and the third bank pattern BP3 may be disposed at the center of the emission area EMA. The third bank pattern BP3 may have a larger width than the first bank pattern BP1 and the second bank pattern BP2 in the second direction DR2. The distance between the bank patterns BP1, BP2 and BP3 in the second direction DR2 may be greater than the distance between the electrodes RME. The first bank pattern BP1 may be disposed to partially overlap the first electrode RME1, and the second bank pattern BP2 may be disposed to partially overlap the fourth electrode RME4. The third bank pattern BP3 may be disposed to partially overlap the second electrode RME2 and the third electrode RME3. Each of the electrodes RME may be disposed such that it does not overlap the bank patterns BP1, BP2 and BP3 at least partially.

The electrodes RME disposed in each sub-pixel SPXn may further include the third electrode RME3 and the fourth electrode RME4 in addition to the first electrode RME1 and the second electrode RME2.

The third electrode RME3 may be disposed between the first electrode RME1 and the second electrode RME2, and the fourth electrode RME4 may be spaced apart from the third electrode RME3 in the second direction DR2 with the second electrode RME2 therebetween. The first electrode RME1, the third electrode RME3, the second electrode RME2 and the fourth electrode RME4 may be arranged in this order from the left side to the right side of the sub-pixel SPXn. The electrodes RME may be spaced apart from each other in the second direction DR2 to face each other. The electrodes RME in different sub-pixels SPXn adjacent to each other in the first direction DR1 may be spaced apart from each other at the separation region ROP in the subsidiary area SA.

Among the electrodes RME, the first electrode RME1 and the second electrode RME2 may contact the first conductive pattern CDP1 and the second voltage line VL2 disposed thereunder through electrode contact holes CTD and CTS under the bank layer BNL, respectively, whereas the third electrode RME3 and the fourth electrode RME4 may not.

The contacts CT1, CT2, CT3 and CT4 formed in the first insulating layer PAS1 may overlap different electrodes RME, respectively. For example, the contacts CT1, CT2, CT3 and CT4 may be disposed in the subsidiary area SA, and may include a first contact CT1 overlapping the first electrode RME1, a second contact CT2 overlapping the second electrode RME2, a third contact CT3 overlapping the third electrode RME3, and a fourth contact CT4 overlapping the fourth electrode RME4. The contacts CT1, CT2, CT3 and CT4 may penetrate through the first insulating layer PAS1 to partially expose the upper surfaces of the electrodes RME thereunder. The contacts CT1, CT2, CT3 and CT4 may further penetrate some of the other insulating layers disposed on the first insulating layer PAS1.

The light-emitting elements ED may be disposed between the bank patterns BP1, BP2 and BP3 or on different electrodes RME. Some of the light-emitting elements ED may be disposed between the first bank pattern BP1 and the third bank pattern BP3, and some others thereof may be disposed between the third bank pattern BP3 and the second bank pattern BP2. According to an embodiment of the disclosure, the light-emitting elements ED may include the first light-emitting element ED1 and the third light-emitting element ED3 disposed between the first bank pattern BP1 and the third bank pattern BP3, and the second light-emitting element ED2 and the fourth light-emitting element ED4 disposed between the third bank pattern BP3 and the second bank pattern BP2. The first light-emitting element ED1 and the third light-emitting element ED3 may be disposed on the first electrode RME1 and the third electrode RME3, and the second light-emitting element ED2 and the fourth light-emitting element ED4 may be disposed on the second electrode RME2 and the fourth electrode RME4. The first light-emitting element ED1 and the second light-emitting element ED2 may be disposed adjacent to the lower side in the emission area EMA or to the subsidiary area SA of the respective sub pixel SPXn. The third light-emitting element ED3 and the fourth light-emitting element ED4 may be disposed adjacent to the upper side in the emission area EMA of the respective sub-pixel SPXn.

It is to be noted that the light-emitting elements ED may not be sorted by their positions in the emission area EMA but may be sorted by connection relationships with the connection electrodes CNE, which will be described below. The ends of the light-emitting elements ED may contact different connection electrodes CNE depending on the arrangement structure of the connection electrodes CNE, and may be sorted into different light-emitting elements ED depending on the types of the connection electrodes CNE which they contact.

The connection electrodes CNE may further include the third connection electrode CNE3, the fourth connection electrode CNE4 and the fifth connection electrode CNE5 disposed across the electrodes RME, in addition to the first connection electrode CNE1 disposed on the first electrode RME1 and the second connection electrode CNE2 disposed on the second electrode RME2.

Unlike the embodiment of FIG. 4, each of the first and second connection electrodes CNE1 and CNE2 may have relatively short lengths extended in the first direction DR1. The first connection electrode CNE1 and the second connection electrode CNE2 may be disposed on the lower side of the center of the emission area EMA. The first connection electrode CNE1 and the second connection electrode CNE2 may be disposed across the emission area EMA and the subsidiary area SA of the respective sub-pixel SPXn, and may directly contact the electrodes RME through the contacts CT1 and CT2 formed in the subsidiary area SA. The first connection electrode CNE1 may directly contact the first electrode RME1 through the first contact CT1 penetrating the first insulating layer PAS1, the second insulating layer PAS2 and the third insulating layer PAS3 in the subsidiary area SA, and the second connection electrode CNE2 may directly contact the second electrode RME2 through the second contact CT2 penetrating the first insulating layer PAS1, the second insulating layer PAS2 and the third insulating layer PAS3 in the subsidiary area SA.

The third connection electrode CNE3 may include a first extended portion CN_E1 disposed on the third electrode RME3, a second extended portion CN_E2 disposed on the first electrode RME1, and a first bridge portion CN_B connecting the first extended portion CN_E1 and the second extended portion CN_E2. The first extended portion CN_E1 may be spaced apart from and face the first connection electrode CNE1 in the second direction DR2, and the second extended portion CN_E2 may be spaced apart from the first connection electrode CNE1 in the first direction DR1. The first extended portion CN_E1 may be disposed on the lower side in the emission area EMA of the respective sub-pixel SPXn, and the second extended portion CN_E2 may be disposed on the upper side in the emission area EMA. The first extended portion CN_E1 and the second extended portion CN_E2 may be disposed in the emission area EMA. The first bridge CN_B1 may be disposed across the first electrode RME1 and the third electrode RME3 in the middle of the emission area EMA. The third connection electrode CNE3 may be generally extended in the first direction DR1 and may have a shape that is bent in the second direction DR2 and extended in the first direction DR1 again.

The fourth connection electrode CNE4 may include a third extended portion CN_E3 disposed on the fourth electrode RME4, a fourth extended portion CN_E4 disposed on the second electrode RME2, and a second bridge portion CN_B2 connecting the third extended portion CN_E3 and the fourth extended portion CN_E4. The third extended portion CN_E3 may be spaced apart from and face the second connection electrode CNE2 in the second direction DR2, and the fourth extended portion CN_E4 may be spaced apart from the second connection electrode CNE2 in the first direction DR1. The third extended portion CN_E3 may be disposed on the lower side in the emission area EMA of the respective sub-pixel SPXn, and the fourth extended portion CN_E4 may be disposed on the upper side in the emission area EMA. The third extended portion CN_E3 and the fourth extended portion CN_E4 may be disposed in the emission area EMA. The second bridge portion CN_B2 may be disposed across the second electrode RME2 and the fourth electrode RME4 and may be adjacent to the center of the emission area EMA. The fourth connection electrode CNE4 may be generally extended in the first direction DR1 and may have a shape that is bent in the second direction DR2 and extended in the first direction DR1 again.

The fifth connection electrode CNE5 may include a fifth extended portion CN_E5 disposed on the third electrode RME3, a sixth extended portion CN_E6 disposed on the fourth electrode RME4, and a third bridge portion CN_B3 connecting the fifth extended portion CN_E5 and the sixth extended portion CN_E6. The fifth extended portion CN_E5 may be spaced apart from and face the second extended portion CN_E2 of the third connection electrode CNE3 in the second direction DR2, and the sixth extended portion CN_E6 may be spaced apart from and face a fourth extended portion CN_E4 of the fourth connection electrode CNE4 in the second direction DR2. The fifth extended portion CN_E5 and the sixth extended portion CN_E6 may be disposed on the upper side in the emission area EMA, and the third bridge portion CN_B3 may be disposed across the third electrode RME3, the second electrode RME2, and the fourth electrode RME4. The fifth connection electrode CNE5 may be disposed in a shape that surrounds the fourth extended portion CN_E4 of the fourth connection electrode CNE4 in a plan view.

The third connection electrode CNE3 may directly contact the third electrode RME3 through the third contact CT3 penetrating the first insulating layer PAS1 and the second insulating layer PAS2 in the subsidiary area SA, and the fourth connection electrode CNE4 may directly contact the fourth electrode RME4 through the fourth contact CT4 penetrating the first insulating layer PAS1 and the second insulating layer PAS2 in the subsidiary area SA.

The first connection electrode CNE1 may contact the first ends of the first light-emitting elements ED1, and the second connection electrode CNE2 may contact the second ends of the second light-emitting elements ED2. The third connection electrode CNE3 may contact the second ends of the first light-emitting elements ED1, and the first ends of the third light-emitting elements ED3. The fourth connection electrode CNE4 may contact the second ends of the fourth light-emitting elements ED4, and the first ends of the second light-emitting elements ED2. The fifth connection electrode CNE5 may contact the second ends of the third light-emitting elements ED3, and the first ends of the fourth light-emitting elements ED4.

The light-emitting elements ED may be sorted into different light-emitting elements ED by the connection electrodes CNE which their ends contact, in accordance with the arrangement structure of the connection electrodes CNE. The first light-emitting elements ED1 may contact the first connection electrode CNE1 and the third connection electrode CNE3, and the second light-emitting elements ED2 may contact the second connection electrode CNE2 and the fourth connection electrode CNE4. The third light-emitting element ED3 may contact the third connection electrode CNE3 and the fifth connection electrode CNE5, and the fourth light-emitting element ED4 may contact the fourth connection electrode CNE4 and the fifth connection electrode CNE5.

The light-emitting elements ED may be connected in series to each other through the connection electrodes CNE. According to this embodiment, the display device 10 includes a greater number of light-emitting elements ED for each of the sub-pixels SPXn to form the serial connection, thereby further increasing the amount of emitted light per unit area.

According to the embodiment of the disclosure, the third connection electrode CNE3 may be extended in the second direction DR2 to overlap the first connection electrode CNE1 and may overlap the fifth connection electrode CNE5. For example, the first extended portion CN_E1 of the third connection electrode CNE3 may overlap the first connection electrode CNE1 on the third insulating layer PAS3, and the second extended portion CN_E2 of the third connection electrode CNE3 may overlap the fifth extended portion CN_E5 of the fifth connection electrode CNE5 on the third insulating layer PAS3.

The width W3 of the third connection electrode CNE3 in the second direction DR2 may be greater than the width W1 of the first connection electrode CNE1 in the second direction DR2 and the width W2 of the second connection electrode CNE2 in the second direction DR2. For example, the width W3 of the first extended portion CN_E1 and the second extended portion CN_E2 of the third connection electrode CNE3 may be greater than the width W1 of the first connection electrode CNE1 and the width W2 of the second connection electrode CNE2. The width W3 of the third connection electrode CNE3 in the second direction DR2 may be greater than the width W5 of the fifth extended portion CN_E5 and the sixth extended portion CN_E6 of the fifth connection electrode CNE5. The area of the third connection electrode CNE3 may be larger than the area of each of the first connection electrode CNE1, the second connection electrode CNE2 and the fifth connection electrode CNE5.

The fourth connection electrode CNE4 may be extended in the second direction DR2 to overlap the second connection electrode CNE2 and may overlap the fifth connection electrode CNE5. For example, the third extended portion CN_E3 of the fourth connection electrode CNE4 may overlap the second connection electrode CNE2 on the third insulating layer PAS3, and the fourth extended portion CN_E4 of the fourth connection electrode CNE4 may overlap the sixth extended portion CN_E6 of the fifth connection electrode CNE5 on the third insulating layer PAS3.

The width W4 of the fourth connection electrode CNE4 in the second direction DR2 may be greater than the width W1 of the first connection electrode CNE1 in the second direction DR2 and the width W2 of the second connection electrode CNE2 in the second direction DR2. For example, the width W4 of the third extended portion CN_E3 and the fourth extended portion CN_E4 of the fourth connection electrode CNE4 may be greater than the width W1 of the first connection electrode CNE1 and the width W2 of the second connection electrode CNE2. The width W4 of the fourth connection electrode CNE4 in the second direction DR2 may be greater than the width W5 of each of the fifth extended portion CN_E5 and the sixth extended portion CN_E6 of the fifth connection electrode CNE5. The area of the fourth connection electrode CNE4 may be larger than the area of each of the first connection electrode CNE1, the second connection electrode CNE2 and the fifth connection electrode CNE5.

The width W3 and the area of the third connection electrode CNE3 may be equal to the width W4 and the area of the fourth connection electrode CNE4, respectively. It should be understood, however, that the disclosure is not limited thereto. The width W3 and the area of the third connection electrode CNE3 may be different from the width W4 and the area of the fourth connection electrode CNE4, respectively. According to an embodiment of the disclosure, the width W3 and the area of the third connection electrode CNE3 may be less than or greater than the width W4 and the area of the fourth connection electrode CNE4, respectively.

As described above, the widths and areas of the third connection electrode CNE3 and the fourth connection electrode CNE4 exposed on the third insulating layer PAS3 are greater than those of the first connection electrode CNE1, the second connection electrode CNE2 and the fifth connection electrode CNE5 adjacent thereto, so that it is possible to achieve an overcurrent protection structure that allows static electricity to escape through the wider third connection electrode CNE3 and fourth connection electrode CNE4 if static electricity is generated. In this manner, it is possible to improve damage to the third connection electrode CNE3, the fourth connection electrode CNE4 and the light-emitting elements ED (ED1, ED2, ED3 and ED4), thereby addressing dark spot defects.

Although the above-described embodiment of FIGS. 18 to 21 has been described by applying the embodiment of FIGS. 4 to 8, but the disclosure is not limited thereto. The embodiment of FIGS. 10 to 17 may be applied as well.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

first and second electrodes disposed on a substrate, extended parallel to each other, and spaced apart from each other;

light-emitting elements disposed on the first electrode and the second electrode;

a first insulating layer covering at least a portion of each of the light-emitting elements;

a first connection electrode disposed on the light-emitting elements and electrically contacting a first end of each of the light-emitting elements; and a second connection electrode disposed on the light-emitting elements and the first insulating layer and electrically contacting a second end of each of the light-emitting elements, wherein the second connection electrode overlaps both ends of one of the light-emitting elements in a thickness direction, and wherein the first connection electrode and the second connection electrode overlap each other in the thickness direction.

2. The display device of claim 1, wherein a width of the second connection electrode is greater than a width of the first connection electrode in a longitudinal direction of the light-emitting elements.

3. The display device of claim 1, wherein the first connection electrode partially overlaps the light-emitting elements in the thickness direction while the second connection electrode entirely overlaps the light-emitting elements in the thickness direction.

4. The display device of claim 1, wherein the first connection electrode overlaps the first electrode but does not overlap the second electrode in the thickness direction, and wherein the second connection electrode overlaps the first electrode and the second electrode in the thickness direction.

5. The display device of claim 1, wherein an area of the second connection electrode is larger than an area of the first connection electrode.

6. The display device of claim 1, wherein the first insulating layer comprises:

a first opening exposing the first end of each of the light-emitting elements; and a second opening exposing the second end of each of the light-emitting elements, and wherein an area of the second opening is larger than an area of the first opening.

7. The display device of claim 6, wherein the first connection electrode electrically contacts the light-emitting elements through the first opening, and wherein the second connection electrode electrically contacts the light-emitting elements through the second opening.

8. The display device of claim 7, wherein a contact area between the second connection electrode and the light-emitting elements is larger than a contact area between the first connection electrode and the light-emitting elements.

9. The display device of claim 6, further comprising a second insulating layer disposed between the first connection electrode and the second connection electrode to insulate the first connection electrode from the second connection electrode.

10. The display device of claim 9, wherein the first insulating layer and the second insulating layer comprise a third opening formed between the first opening and the second opening to expose upper surfaces of the light-emitting elements, and wherein the second connection electrode electrically contacts the upper surfaces of the light-emitting elements through the third opening.

11. The display device of claim 10, wherein the first connection electrode is spaced apart from the first opening in a plan view.

12. A display device comprising:

first and second electrodes disposed on a substrate, extended parallel to each other, and spaced apart from each other;

light-emitting elements disposed on the first electrode and the second electrode;

a first insulating layer comprising openings partially exposing the light-emitting elements;

a first connection electrode disposed on the light-emitting elements and electrically contacting a first end of each of the light-emitting elements; and a second connection electrode disposed on the light-emitting elements and the first insulating layer and electrically contacting a second end of each of the light-emitting elements, wherein a physical contact area between the second connection electrode and the light-emitting elements is larger than a physical contact area between the first connection electrode and the light-emitting elements, and wherein the second connection electrode is overlapped with the first electrode and the second electrode in a thickness direction.

13. The display device of claim 12, wherein the openings of the first insulating layer comprise:

a first opening exposing the first end of each of the light-emitting elements; and a second opening exposing the second end of each of the light-emitting elements, wherein the first connection electrode electrically contacts the first end of each of the light-emitting elements through the first opening, and wherein the second connection electrode electrically contacts the second end of each of the light-emitting elements through the second opening.

14. The display device of claim 13, wherein the openings of the first insulating layer comprise a third opening formed between the first opening and the second opening to expose a portion of an upper surface of each of the light-emitting elements, and wherein the second connection electrode electrically contacts the portion of the upper surface of each of the light-emitting elements through the third opening.

15. The display device of claim 14, wherein an area of the second opening is larger than an area of the first opening and larger than an area of the third opening, and wherein the area of the third opening is smaller than the area of the first opening.

16. The display device of claim 12, wherein an area of the second connection electrode is larger than an area of the first connection electrode.

17. The display device of claim 12, wherein the first connection electrode and the second connection electrode overlap each other in the thickness direction.

18. A display device comprising:

first and second electrodes disposed on a substrate, extended parallel to each other and spaced apart from each other;

light-emitting elements disposed on the first electrode and the second electrode;

a first insulating layer covering at least a portion of each of the light-emitting elements and comprising an organic material;

a first connection electrode disposed on the light-emitting elements and the first insulating layer and electrically contacting a first end of each of the light-emitting elements; and a second connection electrode disposed on the light-emitting elements and the first insulating layer and electrically contacting a second end of each of the light-emitting elements, wherein the first insulating layer comprises a protrusion that protrudes from at least a portion of its upper surface.

19. The display device of claim 18, wherein the first connection electrode is extended from one side of the first insulating layer to one side of the protrusion, and wherein the second connection electrode is extended from an opposite side of the first insulating layer to an opposite side of the protrusion.

20. The display device of claim 18, wherein the first connection electrode and the second connection electrode are spaced apart from each other with the protrusion disposed between the first and second connection electrodes.

* * * * *